(12) United States Patent
Lee et al.

(10) Patent No.: US 7,417,302 B2
(45) Date of Patent: Aug. 26, 2008

(54) SEMICONDUCTOR DEVICE AND METHOD OF MANUFACTURING THE SAME

(75) Inventors: Kyoung-Woo Lee, Seoul (KR); Hong-Jae Shin, Seoul (KR); Jeong-Hoon Ahn, Gwacheon-si (KR); Seung-Man Choi, Gyeonggi-do (KR); Byung-Jun Oh, Suwon-si (KR); Yoon-Hae Kim, Sungnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/174,864

(22) Filed: Jul. 5, 2005

(65) Prior Publication Data

US 2006/0009065 A1   Jan. 12, 2006

(30) Foreign Application Priority Data

Jul. 6, 2004   (KR) .................. 10-2004-0052468

(51) Int. Cl.
*H01L 29/00* (2006.01)
(52) U.S. Cl. .............. 257/532; 257/301; 257/306; 257/310; 257/774; 257/E29.029; 257/E21.661; 257/E27.016; 257/E27.098; 439/395
(58) Field of Classification Search .......... 257/532, 257/301, 306, 310, 774; 439/395
See application file for complete search history.

(56) References Cited

U.S. PATENT DOCUMENTS

| | | | |
|---|---|---|---|
| 6,238,963 B1 | 5/2001 | Chen et al. | 438/239 |
| 6,320,244 B1 | 11/2001 | Alers et al. | 257/534 |
| 6,346,454 B1 | 2/2002 | Sung et al. | 438/396 |
| 6,391,707 B1 * | 5/2002 | Dirnecker et al. | 438/250 |
| 6,452,251 B1 | 9/2002 | Bernstein et al. | 257/532 |
| 6,617,208 B2 | 9/2003 | Saran | 438/240 |
| 7,220,652 B2 * | 5/2007 | Kim et al. | 438/386 |
| 2006/0289999 A1 * | 12/2006 | Lee et al. | 257/762 |

FOREIGN PATENT DOCUMENTS

| | | |
|---|---|---|
| KR | 2003-0077284 | 10/2003 |
| KR | 1020040004809 | 1/2004 |

* cited by examiner

*Primary Examiner*—Ahmed Sefer
(74) *Attorney, Agent, or Firm*—Mills & Onello LLP

(57) ABSTRACT

In a method of manufacturing a semiconductor device, a first insulation layer on the substrate is patterned to form a first opening having a first width. A lower electrode is formed along an inner contour of the first opening. A second insulation layer on the first insulation layer is patterned to form a second opening that has a second width greater than the first width and is connected to the first opening with a stepped portion. A dielectric layer is formed on the lower electrode in the first opening, a sidewall of the second opening and a first stepped portion between the first insulation layer and the second insulation layer, so that the electrode layer is covered with the dielectric layer. An upper electrode is formed on the dielectric layer. Accordingly, a leakage current between the lower and upper electrodes is suppressed.

20 Claims, 20 Drawing Sheets

SEMICONDUCTOR DEVICE AND METHOD OF MANUFACTURING THE SAME

CROSS-REFERENCE TO RELATED APPLICATION

This application relies for priority upon Korean Patent Application No. 2004-52468 filed on Jul. 6, 2004, the content of which is herein incorporated by reference in its entirety.

BACKGROUND OF THE INVENTION

1. Field of the Invention

The present invention relates to a semiconductor device and a method of manufacturing the same, and more particularly, to a semiconductor device including a capacitor and a method of manufacturing the same.

2. Description of the Related Art

Recent advances require semiconductor devices to process larger amounts of data in shorter amounts of time. As a result, it is necessary to increase integration degree and performance of the semiconductor device. In a general semiconductor device, an electron is stored in a capacitor, so that the capacitor is also required to be scaled down in size and to have increased capacitance.

A conventional capacitor includes a lower electrode, an upper electrode and a dielectric layer interposed between the lower and upper electrodes. The lower electrode generally comprises polysilicon, and the dielectric layer usually comprises a tantalum compound or a compound including barium (Ba) and strontium (Sr). In general, the upper electrode comprises titanium (Ti), tungsten (W), platinum (Pt) or polysilicon.

Capacitance C of a capacitor is expressed as the following equation (1):

$$C = \epsilon A_s / d \quad (1)$$

In the above equation (1), C denotes capacitance of the capacitor, $\epsilon$ denotes dielectric constant of a dielectric material in the capacitor, $A_s$ denotes surface area of an electrode of the capacitor and d denotes thickness of the dielectric material in the capacitor.

According to equation (1), the capacitance of a capacitor may be increased (a) by reducing the thickness d of the dielectric material in the capacitor, (b) by increasing the surface area $A_s$ of the electrode of the capacitor, or (c) by using a dielectric material having a high dielectric constant $\epsilon$.

Among the three methods for increasing the capacitance of the capacitor, increasing the surface area $A_s$ of the electrode has been most intensively researched until now.

According to a conventional planar type capacitor, an effective surface area of the capacitor is substantially identical to a projection area of the upper or the lower electrode; thus, increasing the capacitance of the capacitor necessarily requires an increase of the projection area of the electrode. As a result, there is a problem in the conventional planar type capacitor that scale down of the size of the capacitor cannot be practically achieved. A stepped cylindrical capacitor has been developed for solving the basic problem of the planar type capacitor as disclosed in U.S. Pat. No. 6,320,244 (issued to Glenn B. Alers, et al.) and U.S. Pat. No. 6,346,454 (issued to Chun-Yung Sung, et al.).

FIG. 1 is a view illustrating a conventional stepped cylindrical capacitor of a semiconductor device with reference to the above U.S. Pat. No. 6,320,244.

Referring to FIG. 1, a semiconductor device such as an integrated circuit (IC) includes a stepped cylindrical capacitor 24 formed on a substrate 30 including a silicon layer (not shown) on a surface thereof. First, second and third insulation layers 32, 40 and 42, respectively, are sequentially formed on the silicon layer of the substrate 30. A lower wiring 34 is formed in the first insulation layer 32 with a predetermined width. Etching stop layers (not shown) are formed between the first and the second insulation layers 32 and 40, and between the second and the third insulation layers 40 and 42, respectively.

A first opening is formed to have a first width in the third insulation layer 42 and a second opening is formed to have a second width smaller than the first width in the second insulation layer 40. The second opening is continuously connected to the first opening. Then, a lower electrode 44, a dielectric layer 45 and an upper electrode 46 are sequentially formed along sidewalls and bottoms of the first and second openings. A conductive material is deposited on a surface of the third insulation layer 42 to a sufficient thickness to fill up the first and second opening, so that a conductive layer is formed on the third insulation layer and the first and second opening are filled with the conductive layer. Then, the conductive layer is removed and planarized by a chemical mechanical polishing (CMP) process until the top surface of the third insulation layer 42 is exposed; thus, the conductive layer remains only in the first and second openings on the upper electrode to thereby accomplish the stepped cylindrical capacitor 24. The lower electrode and the upper electrode are separated from each other by the CMP process, and are exposed on the same plane.

When operating the stepped cylindrical capacitor 24, a voltage is applied to both the upper and the lower electrodes 44 and 46 positioned on the same plane. However, a current leaks from an end portion of the upper and lower electrodes since both of the electrodes are positioned on the same plane when the voltage is applied. The leakage current causes damage to the capacitor 24, and leads to a fatal failure such as a malfunction of the IC or a breakdown of the IC.

Accordingly, there is still needed an improved stepped cylindrical capacitor for preventing the leakage current from the end portion of the electrodes.

SUMMARY OF THE INVENTION

Accordingly, the present invention provides a semiconductor device including a capacitor with suppressed leakage current and improved capacitance.

The present invention also provides a method of manufacturing a semiconductor device including a capacitor with suppressed leakage current and improved capacitance.

According to an aspect of the present invention, there is provided a semiconductor device including a capacitor comprising a lower electrode, a dielectric layer and an upper electrode. The lower electrode is formed on a sidewall and a bottom of a first opening. The first opening is formed through patterning a first insulation layer to a first width. The dielectric layer is formed along the lower electrode in the first opening and on a sidewall of a second opening and a first stepped portion between the first insulation layer and a second insulation layer on the first insulation layer. The second insulation layer is patterned to a second width greater than the first width to thereby form the second opening that is connected to the first opening with the first stepped portion. The upper electrode is formed on the dielectric layer.

As an exemplary embodiment, the lower electrode is extended to a sidewall and a bottom of a third opening from a second stepped portion between the first insulation layer and a third insulation layer under the first insulation layer. The third insulation layer is patterned to a third width less than the first width to thereby form the third opening that is connected to the first opening with the second stepped portion.

In one embodiment, the bottom of the first opening includes a plurality of protruding portions.

In one embodiment, the lower electrode makes contact with a first lower wiring, and the first lower wiring makes contact with a second lower wiring vertically formed through the first and second insulation layers, so that an electric field is applied to the lower electrode via the first lower wiring by the second lower wiring. In one embodiment, the second lower wiring includes a via-hole and a trench that are consecutively connected with each other.

In one embodiment, the lower and upper electrodes comprise a metal, a metal compound or a mixture thereof.

According to another aspect of the present invention, there is provided a method of manufacturing a semiconductor device including a capacitor for suppressing leakage current and improving capacitance. A substrate is provided to include a first opening having a first width, a second opening having a second width greater than the first width and connected to the first opening, and a lower electrode formed in the first opening. A dielectric layer is formed on the lower electrode in the first opening, a sidewall of the second opening and a first stepped portion between the first insulation layer and the second insulation layer, so that the electrode layer is covered with the dielectric layer. An upper electrode is formed on the dielectric layer.

In one embodiment, a plurality of protruding portions is formed on the bottom of the first opening.

In one embodiment, a first insulation layer formed on the substrate is patterned to the first width to thereby form the first opening, and the lower electrode is formed on the sidewall and the bottom of the first opening. A second insulation layer formed on the first insulation layer is patterned to the second width greater than the first width to thereby form the second opening connected to the first opening with the stepped portion between the first and second insulation layers.

Alternatively, a third insulation layer under the first insulation layer may be patterned to a third width less than the first width to thereby form a third opening connected to the first opening with a second stepped portion between the third insulation layer and the first insulation layer, so that the lower electrode is extended to a sidewall and a bottom of the third opening from the second stepped portion.

In one embodiment, the method further comprises forming a second lower wiring vertically through the first and second insulation layers, the second lower wiring making contact with a first lower wiring under the lower electrode for applying an electric field to the lower electrode. In one embodiment, the second lower wiring is formed in a wiring opening that is formed simultaneously when the first opening is formed. In one embodiment, the first opening and the wiring opening is formed through a dual damascene process. In one embodiment, the second opening and the wiring opening is formed through a dual damascene process.

In one embodiment, providing the substrate includes: forming a first insulation layer on a substrate including a first lower wiring; patterning the first insulation layer to the first width to thereby form the first opening through which the first lower wiring is exposed; forming the lower electrode on a sidewall and a bottom of the first opening; filling the first opening with a conductive material to thereby form a dummy layer at a same level as the first insulation layer; forming a second insulation layer on the dummy layer and the first insulation layer; patterning the second insulation layer to the second width to thereby form the second opening through which the dummy layer is exposed; and removing the exposed dummy layer, so that the lower electrode in the first opening is exposed through the second opening. In one embodiment, the dummy layer is removed through a wet etching. In one embodiment, the conductive material includes copper.

In one embodiment, providing the substrate includes: sequentially forming a third insulation layer and a first insulation layer on a substrate including a first lower wiring; sequentially patterning the first insulation layer and the third insulation layer to the first width and a third width less than the first width, respectively, so that the first opening and a third opening having the third width are formed and the first lower wiring is exposed through the first and the third openings; forming the lower electrode on sidewalls and bottoms of the first and third openings; filling the first and third openings with a conductive material to thereby form a dummy layer at a same level as the first insulation layer; forming a second insulation layer on the dummy layer and the first insulation layer; patterning the second insulation layer to the second width to thereby form the second opening through which the dummy layer is exposed; and removing the exposed dummy layer, so that the lower electrode in the first and third openings is exposed through the second opening. In one embodiment, the dummy layer is removed through a wet etching. In one embodiment, the conductive material includes copper.

According to the present invention, an end portion of the upper electrode is spaced apart from an end portion of the lower electrode by a predetermined distance, so that the leakage current between the lower electrode and the upper electrode is sufficiently prevented in the capacitor. Further, the opening for the capacitor and an opening for lower wirings are formed simultaneously with each other; thus, the processing time and cost for a semiconductor device are remarkably reduced.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of certain lines, layers, components, elements or features may be exaggerated for clarity.

FIGS. 3A to 3I are schematic cross-sectional views illustrating processing steps for a method of manufacturing a semiconductor device according to a second exemplary embodiment of the present invention.

FIGS. 4A to 4I are schematic cross-sectional views illustrating processing steps for a method of manufacturing a semiconductor device according to a third exemplary embodiment of the present invention; and FIGS. 5A to 5I are schematic cross-sectional views illustrating processing steps for a method of manufacturing a semiconductor device according to a fourth exemplary embodiment of the present invention.

DESCRIPTION OF THE EMBODIMENTS

The present invention now will be described more fully hereinafter with reference to the accompanying drawings in which exemplary embodiments of the present invention are shown.

It will be understood that when an element is referred to as being "on", "attached" to, "connected" to, "coupled" with, "contacting", etc., another element, it can be directly on, attached to, connected to, coupled with or contacting the other element or intervening elements may also be present. It will also be appreciated by those of skill in the art that references to a structure or feature that is disposed "adjacent" another feature may have portions that overlap or underlie the adjacent feature.

Embodiment 1

FIGS. 2A to 2G are schematic cross-sectional views illustrating processing steps for a method of manufacturing a semiconductor device according to a first exemplary embodiment of the present invention.

Figure 1:
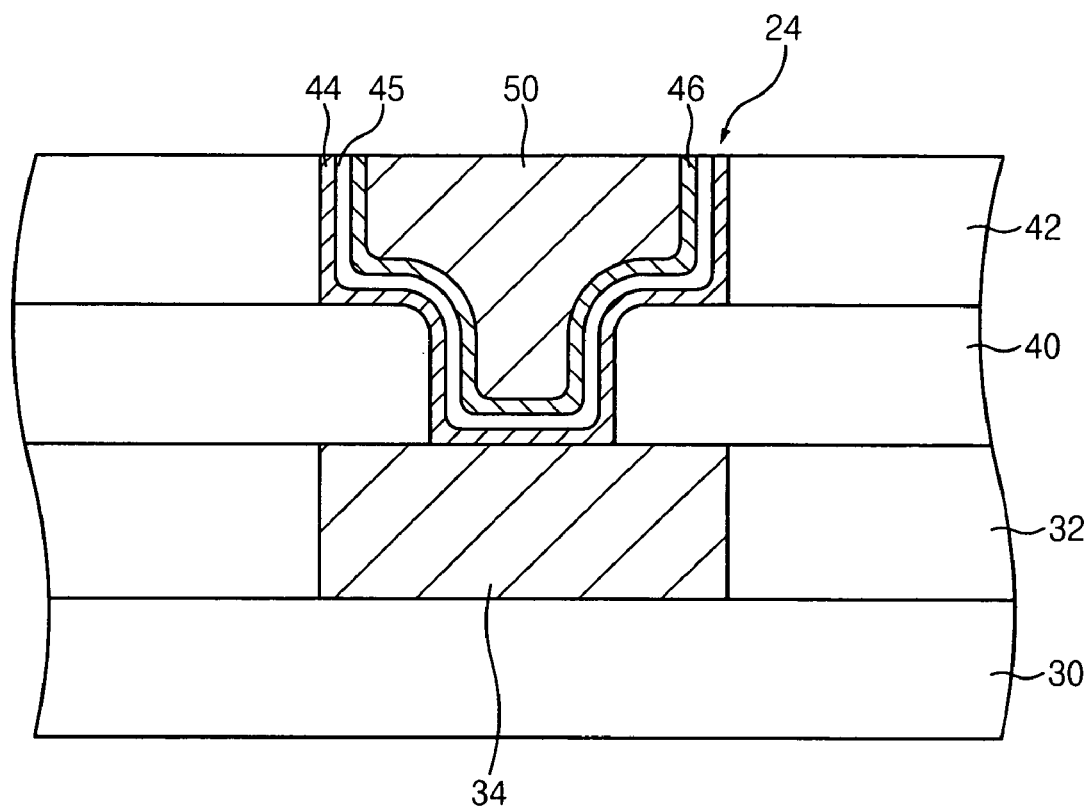
FIG. 1 is a schematic cross-sectional view illustrating a conventional stepped cylindrical capacitor of a semiconductor device.
Figure 2A:
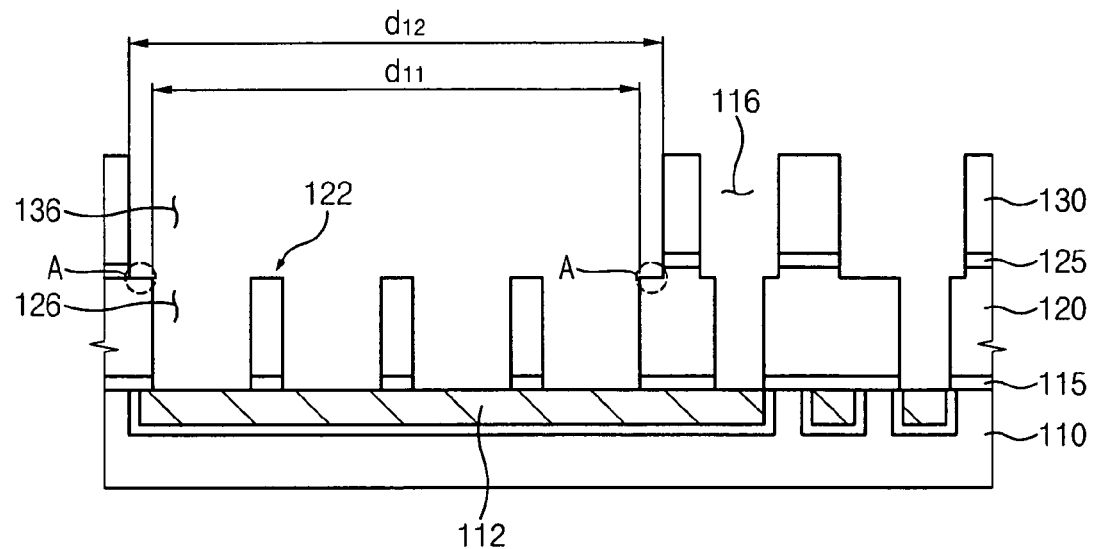
FIGS. 2A to 2G are schematic cross-sectional views illustrating processing steps for a method of manufacturing a semiconductor device according to a first exemplary embodiment of the present invention.

Referring to FIG. 2A, a first lower wiring 112 is formed on a lower insulation layer 110 formed on a semiconductor substrate (not shown) such as a silicon wafer, and a first etching stop layer 115, a first insulation layer 120, a second etching stop layer 125, and a second insulation layer 130 are sequentially formed on the lower insulation layer 110. The first etching stop layer 115 and the first insulation layer 120 are selectively etched to thereby form a first opening 126 having a first width $d_{11}$, and the second etching stop layer 125 and the second insulation layer 130 are selectively etched to thereby form a second opening 136 having a second width $d_{12}$ greater than the first width $d_{11}$, so that a first stepped portion A is formed between the first and second openings 126 and 136 due to the width difference of the first and second openings 126 and 136. A first etching process for the first opening 126 is terminated on the first etching stop layer 115, and a second etching process for the second opening 136 is terminated on the second etching stop layer 125.

In one particular embodiment, the second width $d_{12}$ is formed to be no more than about 4000 Å, and is more preferably formed to be no more than about 5000 Å. The first width $d_{11}$ is formed to be less than the second width $d_{12}$. Further, the first etching stop layer 115 and the first insulation layer 120 are etched such that a plurality of protruding portions 122 remain on a bottom of the first opening 126 for increasing a capacitance of the semiconductor device. In the semiconductor device, the higher the protruding portion is, the greater the capacitance is; thus, the protruding portion 122 is formed to have a height substantially identical to a depth of the first opening 126.

As an exemplary embodiment, a conventional dual damascene process is utilized for forming the first and second openings 126 and 136 through the second insulation layer 130, the second etching stop layer 125, the first insulation layer 120 and the first etching stop layer 115. According to the dual damascene process, a via-hole and a trench are consecutively formed through a photolithography process. The dual damascene process can be classified as one of a via-first process in which the via-hole is formed prior to the trench, a trench-first process in which the trench is formed prior to the via-hole, and a buried trench process in which the via-hole and the trench are formed simultaneously with each other. Any one process among the above three dual damascene processes may be utilized for forming the first and second openings. When the via-first process or the trench-first process is utilized for forming the first and second openings, a priority between the via-hole and the trench is determined in accordance with a size of the via-hole and the trench and an allowable range of a misalignment for the via-hole and the trench.

Figure 2B:
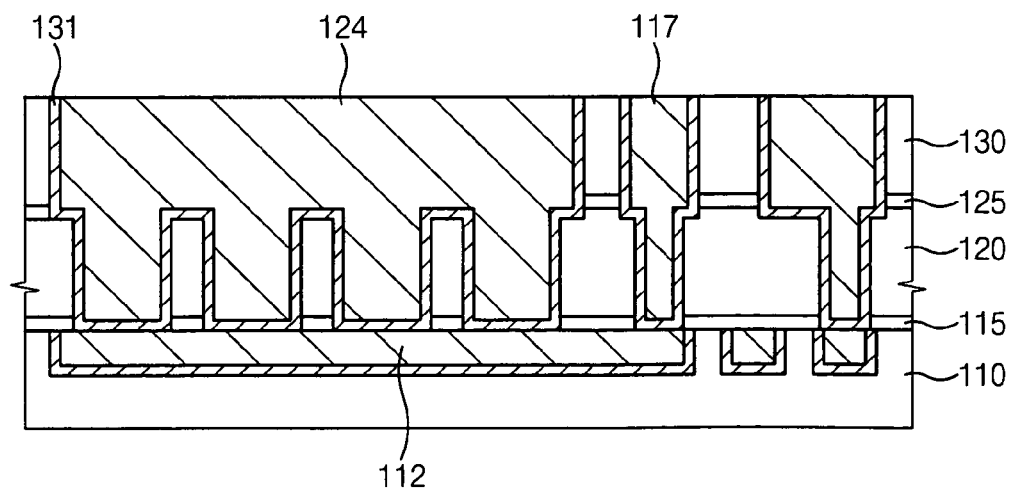

In one embodiment of the present invention, a second wiring opening 116 in which a second lower wiring 117 is formed in a subsequent process is formed during the dual damascene process (FIG. 2B). The second insulation layer 130, the second etching stop layer 125, the first insulation layer 120 and the first etching stop layer 115 are sequentially removed until a top surface of the first lower wiring 112 is exposed. In detail, the second insulation layer 130 and the second etching stop layer 125 are partially etched to thereby form a trench through which a top surface of the first insulation layer 120 is exposed, and the first insulation layer 120 and the first etching stop layer 115 are continuously and partially etched to thereby form a via-hole through which the top surface of the first lower wiring 112 is partially exposed. A width of the trench is formed to be greater than that of the via-hole, so that a stepped portion is also formed between the trench and the via-hole, as shown in FIG. 2A. A priority between the via-hole and the trench in forming the second wiring hole is determined in accordance with a processing order between the first and second openings 126 and 136. The formation of the second lower wiring opening 116 simultaneously with the first and second openings 126 and 136 remarkably reduces a process time and cost as compared with conventional art.

Referring to FIG. 2B, a lower electrode layer (not shown) is formed on the second insulation layer 130, a bottom of the first opening 126 and on a bottom of the second opening 136 corresponding to the first stepped portion A, along sidewalls of the first and second openings 126 and 136, and along surfaces of the protruding portions 122. The lower electrode layer works as a diffusion-preventing layer in a subsequent process, and comprises a metal or a metal compound. Examples of a metal or a metal compound for the lower electrode 131 include tantalum (Ta), tantalum nitride (TaN), chrome (Cr), chrome nitride (CrN), titanium (Ti), titanium nitride (TiN), tungsten (W), tungsten nitride (WN), etc. These may be used alone or in combinations thereof. A physical vapor deposition (PVD) process, a chemical vapor deposition (CVD) process or an atomic layer deposition (ALD) process may be utilized for forming the lower electrode layer. In addition, the lower electrode layer is also formed along a sidewall and a bottom of the second wiring opening 116. The lower electrode in the second wiring opening 116 also functions as a diffusion-preventing layer in a subsequent process.

A first conductive material is coated onto the second insulation layer 130 including the lower electrode layer to a sufficient thickness to fill up the first and second openings 126 and 136 and the second wiring opening 116 to thereby form a first conductive layer (not shown) on the second insulation layer 130. Then, the first conductive layer is removed and planarized by a chemical mechanical polishing (CMP) process until a top surface of the second insulation layer 130 is exposed, so that the lower electrode layer and the first conductive layer remain only in the first and second openings 126 and 136 and in the second wiring opening 116. As a result, a lower electrode 131 is formed along sidewalls and bottoms of the first and second openings 126 and 136 and a dummy layer 124 is formed on the lower electrode 131 in the first and second openings 126 and 136. In the same way, the first conductive layer is transformed into a second lower wiring 117 in the second wiring opening 116.

The second lower wiring 117 applies an electric field to the first lower wiring 112. Although the above exemplary embodiment discusses the CMP process for forming the dummy layer 124 and the second lower wiring 117, the first and second openings 126 and 136 and the second wiring opening 116 may be filled with a conductive material such as a resist etch back (REB) and a spin on glass (SOG), respectively, in place of the CMP process.

Figure 2C:
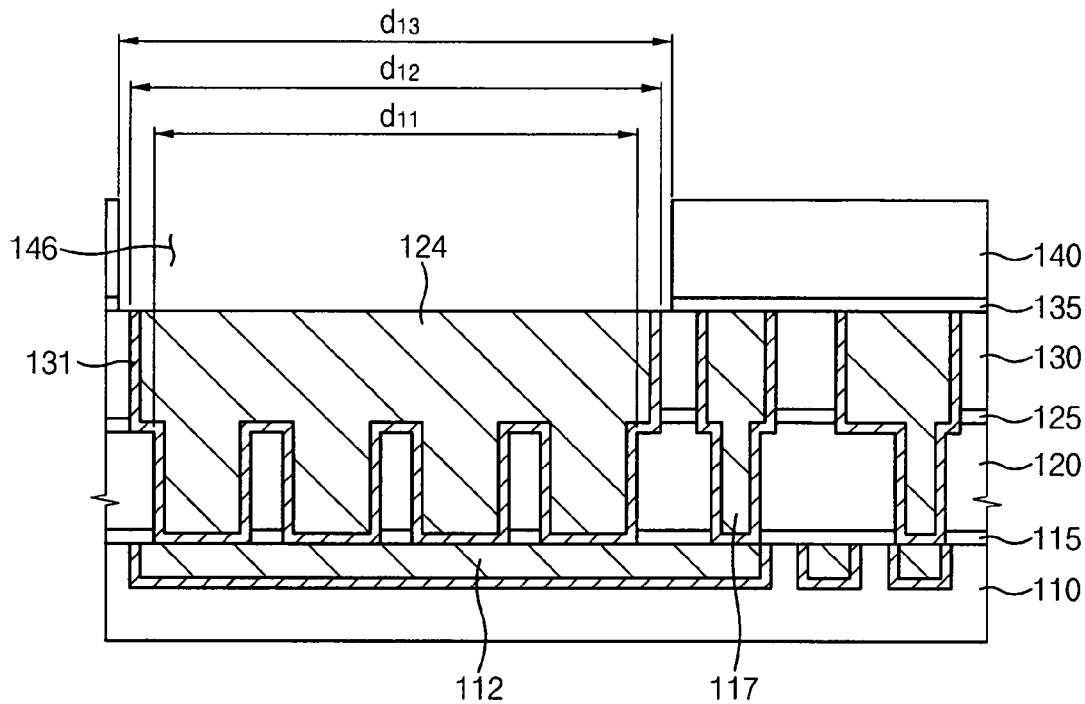
Figure 2D:
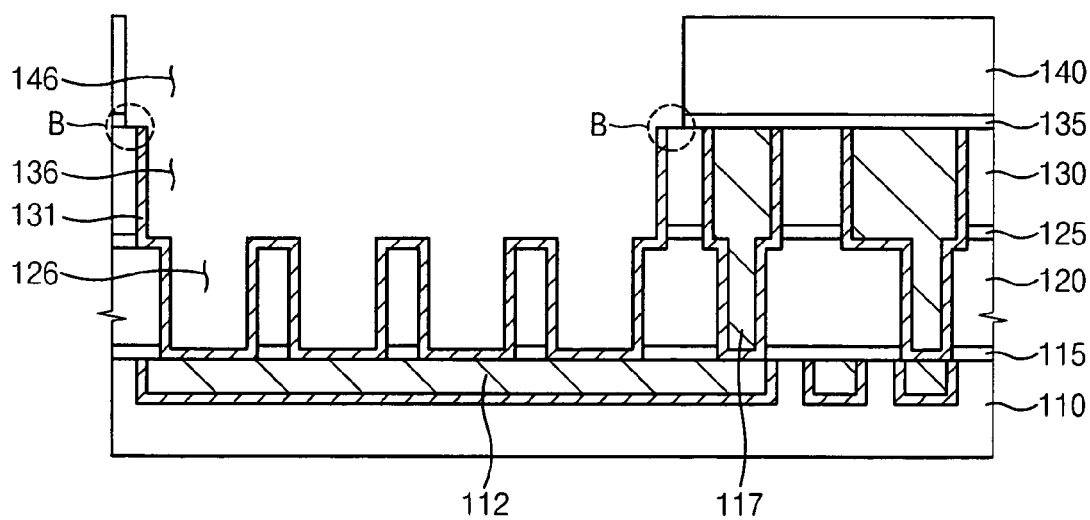

Referring to FIGS. 2C and 2D, a third etching stop layer 135 and a third insulation layer 140 are sequentially formed on the second insulation layer 130, the dummy layer 124 and the second lower wiring 117. Then, the third insulation layer 140 and the third etching stop layer 135 are sequentially and partially removed to thereby form a third opening 146 having a third width $d_{13}$ greater than the second width $d_{12}$, so that the dummy layer 124 and the lower electrode 131 are sufficiently exposed through the third opening 146. That is, a second stepped portion B is formed between the second openings 136 and the third opening 146 due to the width difference of the second and third openings 136 and 146. In such a case, the second lower wiring 117 is still covered with the third etching stop layer 135 and the third insulation layer 140.

Then, the exposed dummy layer 124 is removed by a wet etching process; thus, the lower electrode 131 in the first and second openings 126 and 136 is exposed to surroundings. Examples of an etchant for the wet etching include an aqueous ammonia (NH3) solution, a hydrogen peroxide (H2O2) solution, pure water (H2O), an aqueous nitric acid (NO3) solution, an aqueous hydrochloric acid (HCl) solution, an aqueous sulfuric acid (H2SO4) solution, etc. These can be alone or a mixture thereof.

Figure 2E:
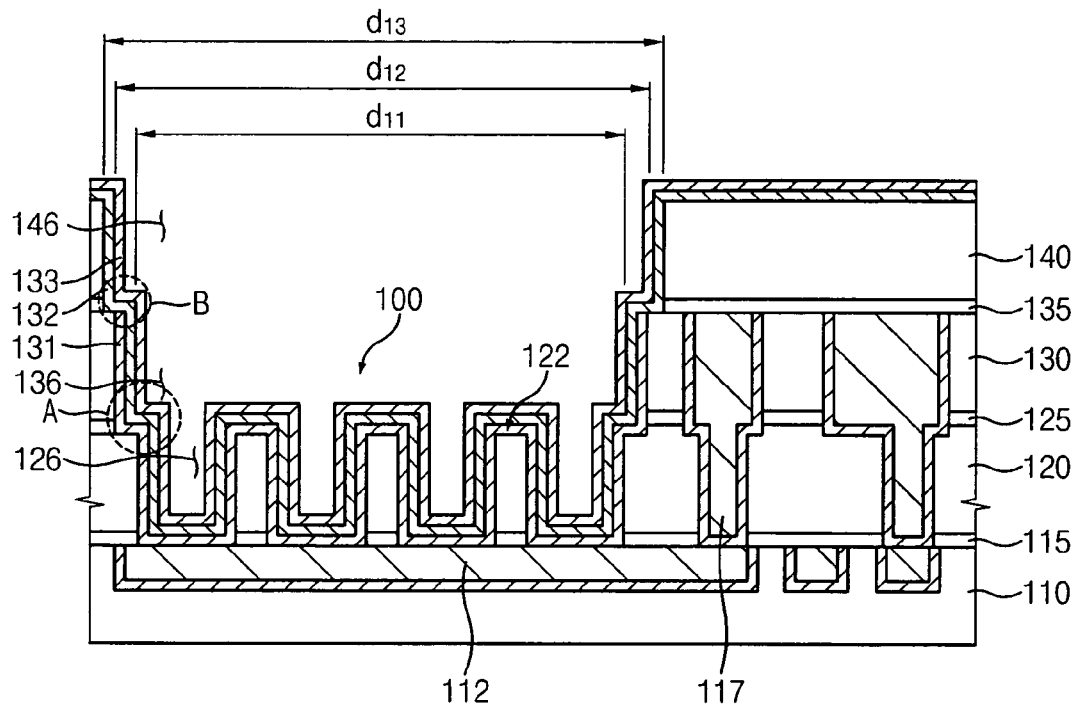

Referring to FIG. 2E, a dielectric layer 132 is formed on the third insulation layer 140 and a bottom of the third opening corresponding to the second stepped portion B, along a sidewall of the third opening 146, and along the lower electrode 131 in the first and second openings 126 and 136, so that the lower electrode 131 is sufficiently covered with the dielectric layer. Then, an upper electrode layer 133 is formed along the dielectric layer 132 in the first, the second and the third openings 126, 136 and 146.

The dielectric layer 132 comprises a material of a high dielectric constant, and the upper electrode 133 comprises a metal or a metal compound. Examples of a material for the dielectric layer 132 include a silicon layer, a hafnium layer, an aluminum oxide layer or a composite layer thereof. Examples the metal or the metal compound for the upper electrode 133 include tantalum (Ta), tantalum nitride (TaN), chrome (Cr), chrome nitride (CrN), titanium (Ti), titanium nitride (TiN), tungsten (W), tungsten nitride (WN), etc. These may be used alone or in combinations thereof. The upper electrode 133 is not always the same as the lower electrode 131 in terms of its composition material.

As a result, a capacitor 100 for a semiconductor device according to the first embodiment is formed to have the lower electrode 131, the dielectric layer 132 and the upper electrode 133 through the above processes. An end portion of the upper electrode 133 is spaced apart from an end portion of the lower electrode 131 at least by a height of the third insulation layer 140, so that the leakage current between the lower electrode 131 and the upper electrode 133 is sufficiently prevented in the capacitor 100.

Figure 2F:
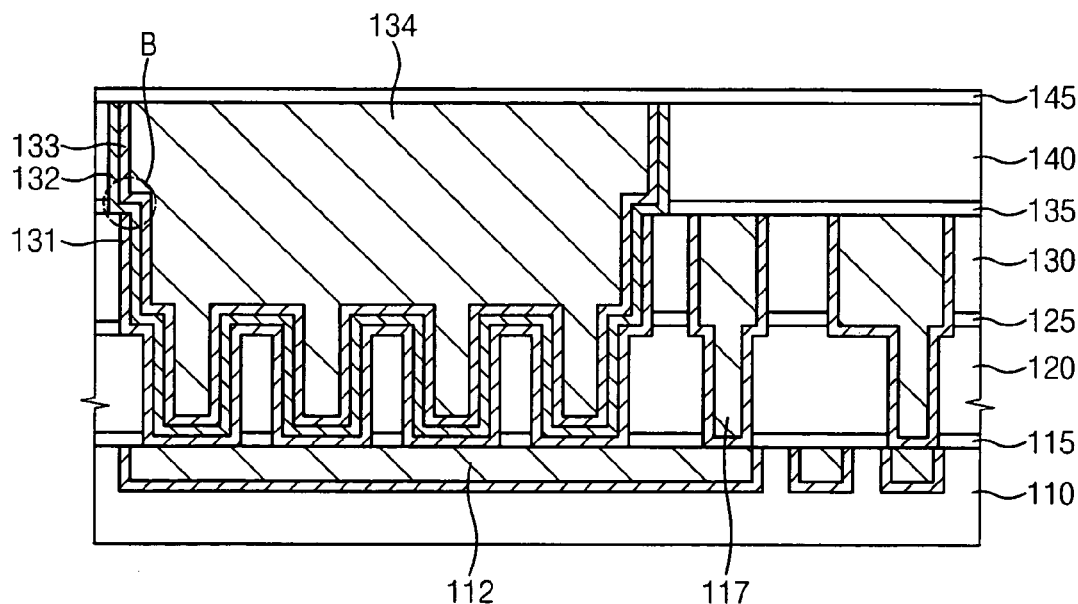

Referring to FIG. 2F, a second conductive material is coated onto the upper electrode 133 to a sufficient thickness to fill up the first, the second and the third openings 126, 136 and 146 to thereby form a second conductive layer (not shown) on the upper electrode layer 133. Then, the second conductive layer is removed and planarized by a chemical mechanical polishing (CMP) process until a top surface of the third insulation layer 140 is exposed, so that the dielectric layer 132, the upper electrode layer 133 and the second conductive layer remain only in the first, the second and the third openings 126, 136 and 146. As a result, the dielectric layer 132 and the upper electrode 133 are formed along an inner profile of the first, the second and the third openings 126, 136 and 146, and the first, the second and the third openings 126, 136 and 146 are filled with a conductive pattern 134. The conductive pattern comprises a metal of a low specific resistance such as aluminum (Al) or copper (Cu). In the present embodiment, the conductive pattern comprises the copper (Cu) or a compound thereof rather than the aluminum (Al) since the copper (Cu) has a lower specific resistance than the aluminum (Al). Then, a third etching stop layer 145 is formed on the conductive pattern 134 and the third insulation layer 140 for terminating an etching process in a subsequent process. Examples for the third etching stop layer 145 include a silicon nitride (SiN) layer, a silicon carbide (SiC) layer, a silicon carbon nitride (SiCN) layer, etc. They can be alone or compositions thereof.

Figure 2G:
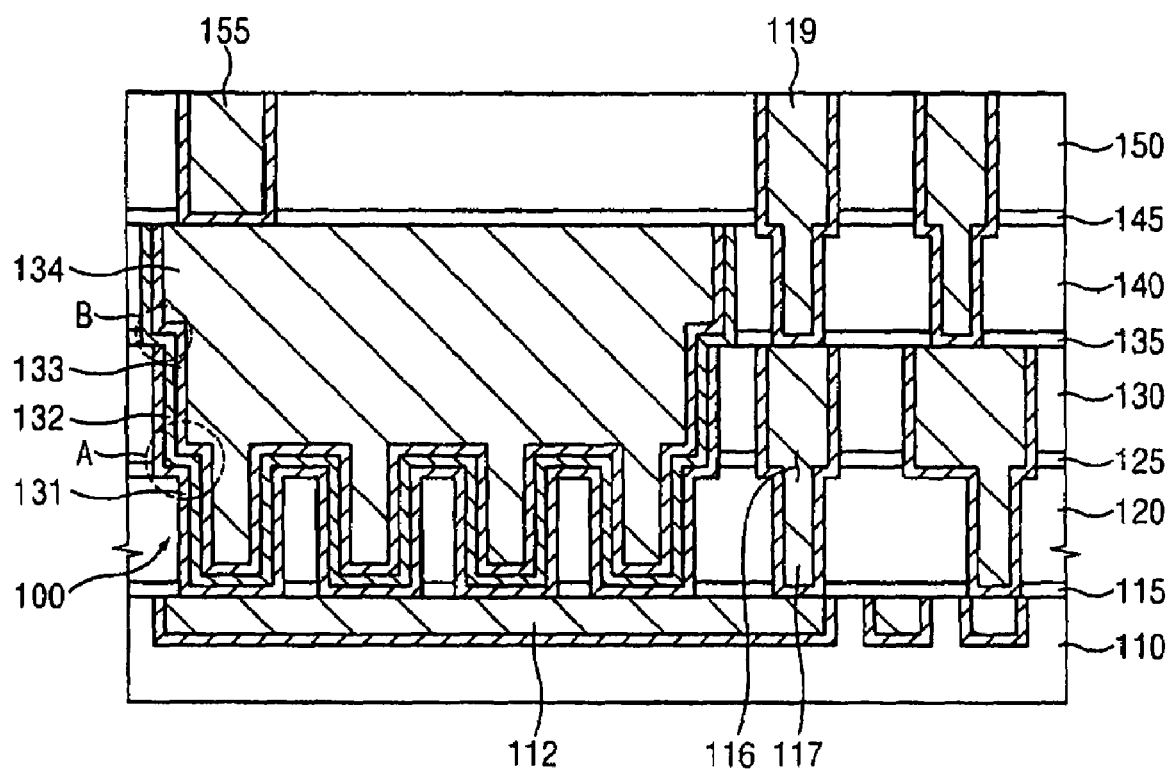

Referring to FIG. 2G, a fourth insulation layer 150 is formed on the third etching stop layer 145, and an upper wiring 155 is formed in the fourth insulation layer 150 for applying an electric field to the upper electrode 133 through the conductive pattern 134. In addition, a third lower wiring 119 is formed through the fourth insulation layer 150, the third etching stop layer 145 and the third insulation layer 140 so as to apply an electric field to the lower electrode 131 through the first and second lower wirings 112 and 117.

According to the present embodiment, an effective surface of the lower electrode 131 is relatively enlarged since the lower electrode 131 is formed along the first and second openings 126 and 136, so that a capacitance of the capacitor 100 is remarkably increased. In addition, an end portion of the upper electrode 133 is spaced apart from an end portion of the lower electrode 131 at least by a height of the third insulation layer 140, so that the leakage current between the lower electrode 131 and the upper electrode 133 is sufficiently suppressed in the capacitor 100. Further, the second and the third lower wirings 117 and 119 are formed simultaneously during the formation of the capacitor 100, so that the processing time and cost for a semiconductor device are remarkably reduced.

Embodiment 2

FIGS. 3A to 3I are views illustrating processing steps for a method of manufacturing a semiconductor device according to a second exemplary embodiment of the present invention.

Figure 3A:
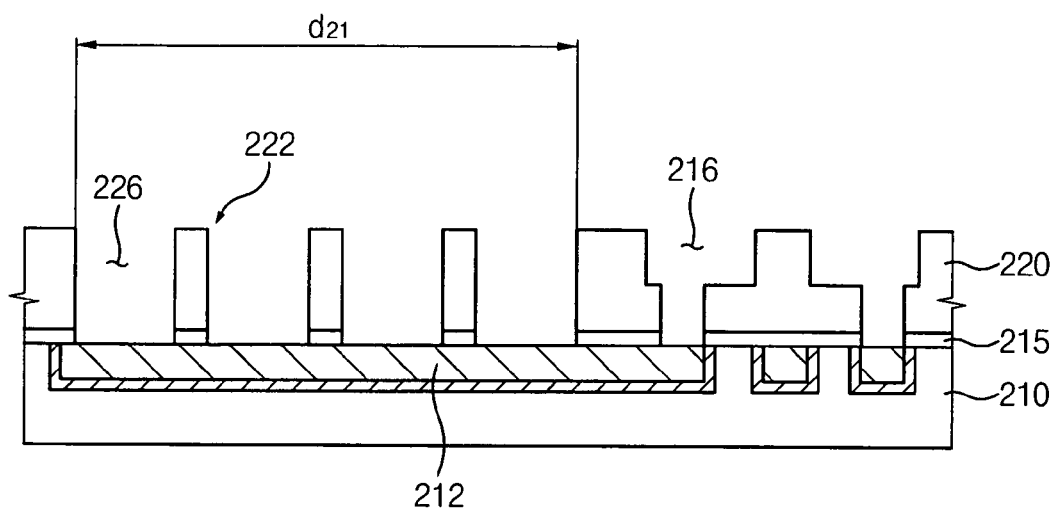

Referring to FIG. 3A, a first lower wiring 212 is formed on a lower insulation layer 210 formed on a semiconductor substrate (not shown) such as a silicon wafer, and a first etching stop layer 215 and a first insulation layer 220 are sequentially formed on the lower insulation layer 210. The first etching stop layer 215 and the first insulation layer 220 are selectively etched to thereby form a first opening 226 having a first width $d_{21}$. An etching process for the first opening 226 is terminated on the first etching stop layer 215. In the present embodiment, the first etching stop layer 215 and the first insulation layer 220 are etched such that a plurality of protruding portions 222 remain on a bottom of the first opening 226 for increasing a capacitance of the semiconductor device. The protruding portion 222 is formed to have a height substantially identical to a depth of the first opening 226. In one embodiment of the present invention, a second wiring opening 216 in which a second lower wiring 217 is formed in a subsequent process is formed by a dual damascene process at the same time when the first opening is formed. A top surface of the lower wiring 212 is partially exposed through the second wiring opening 216.

In detail, the first insulation layer 220 is partially etched to a predetermined depth to thereby form a trench in the first insulation layer 220, and the first insulation layer 220 and the first etching stop layer 215 are continuously and partially etched from a bottom of the trench to thereby form a via-hole through which the top surface of the first lower wiring 212 is partially exposed. As a result, the second wiring opening 216 includes the trench and the via-hole under the trench, and a width of the trench is greater than that of the via-hole for increasing an allowable region of alignment of a second lower wiring 217 in a subsequent process, so that a stepped portion is also formed between the trench and the via-hole, as shown in FIG. 3A.

The first opening 226 is formed at the same time when the second wiring opening 216 is formed by the same process as the second wiring opening 216. As a result, the first opening 226 is formed through the dual damascene process to a width substantially identical to that of the second wiring opening 216.

Figure 3B:
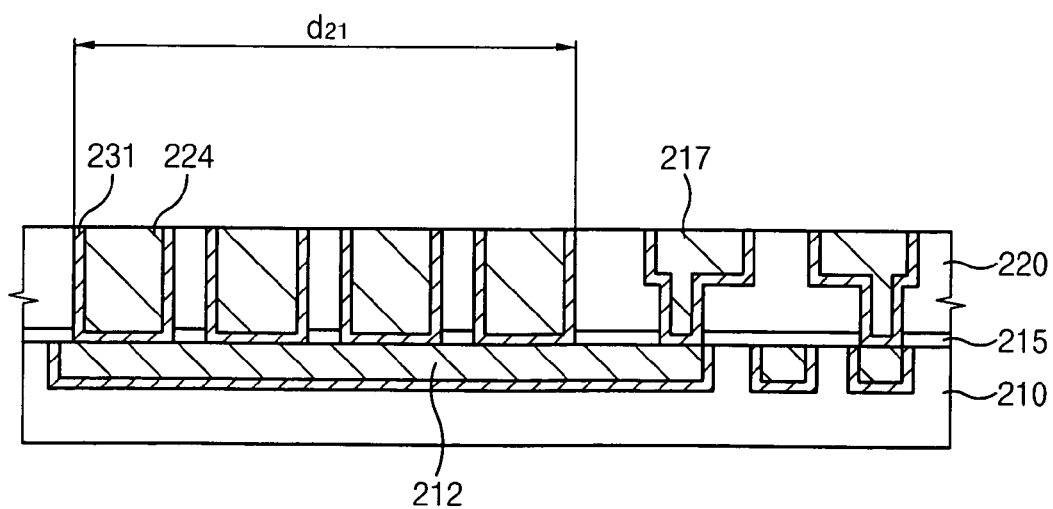

Referring to FIG. 3B, a lower electrode 231 is formed on a sidewall and a bottom of the first opening 226 at a predetermined height. In such a case, the lower electrode 231 is also formed on a sidewall and a bottom of the second wiring opening 216. The lower electrode 231 in the first opening 226 functions as an electrode of a capacitor 200 and a diffusion barrier layer, and the lower electrode 231 in the second wiring opening 216 functions as a diffusion barrier layer. In one embodiment, the lower electrode comprises a metal or a metal compound. Examples of the metal or the metal compound for the lower electrode 231 include tantalum (Ta), tantalum nitride (TaN), chrome (Cr), chrome nitride (CrN), titanium (Ti), titanium nitride (TiN), tungsten (W), tungsten nitride (WN), etc. These may be used alone or in combinations thereof.

A first conductive material is coated onto the first insulation layer 220 including the lower electrode 231 to a sufficient thickness to fill up the first opening 226 and the second wiring opening 216 to thereby form a first conductive layer (not shown) on the first insulation layer 220. Then, the first conductive layer is removed and planarized until a top surface of the first insulation layer 220 is exposed, so that the lower electrode 231 and the first conductive layer remain only in the first opening 226 and in the second wiring opening 216. As a result, the lower electrode 231 is formed along sidewalls and bottoms of the first opening 226 and a dummy layer 224 is formed on the lower electrode 231 in the first opening 226. In the same way, the first conductive layer is transformed into a second lower wiring 217 in the second wiring opening 216.

Figure 3C:
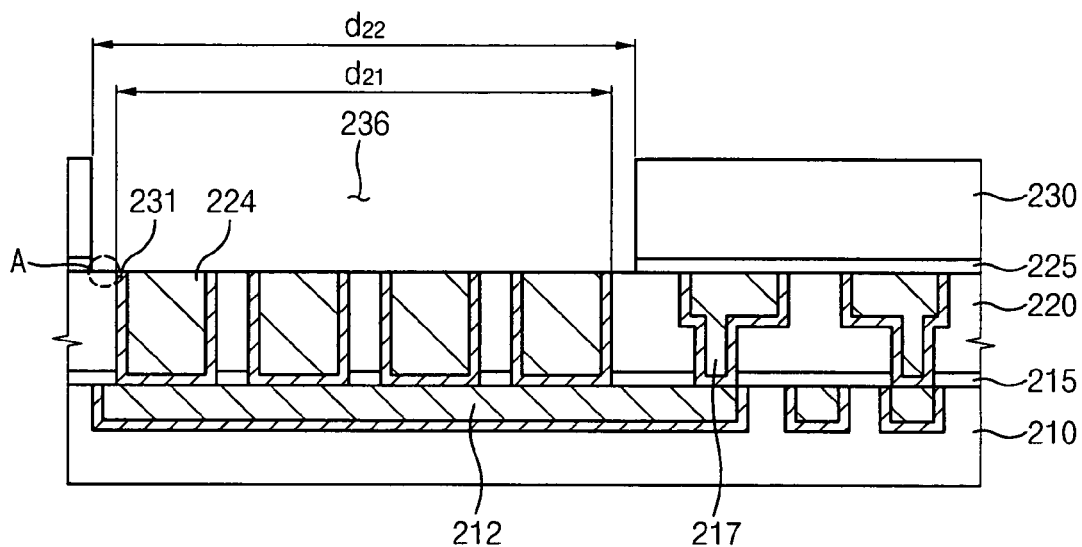
Figure 3D:
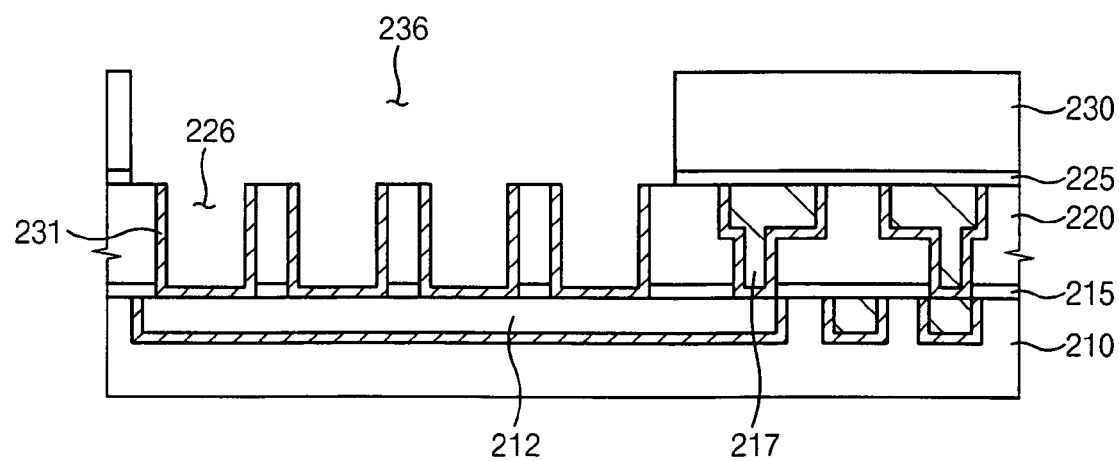

Referring to FIGS. 3C and 3D, a second etching stop layer 225 and a second insulation layer 230 are sequentially formed on the first insulation layer 220, the dummy layer 224 and the second lower wiring 217. Then, the second insulation layer 230 and the second etching stop layer 225 are sequentially and partially removed to thereby form a second opening 236 having a second width $d_{22}$ greater than the first width $d_{21}$ of the first opening 226, so that the dummy layer 224 and the lower electrode 231 are sufficiently exposed through the second opening 236. That is, a stepped portion A is formed between the first openings 226 and the second opening 236 due to the width difference of the first and second openings 226 and 236. In that case, the second lower wiring 217 is still covered with the second etching stop layer 225 and the second insulation layer 230.

Then, the exposed dummy layer 224 is removed by a wet etching process; thus, the lower electrode 231 in the first opening 226 is exposed to surroundings. Examples of an etchant for the wet etching include an aqueous ammonia (NH3) solution, a hydrogen peroxide (H2O2) solution, pure water (H2O), an aqueous nitric acid (NO3) solution, an aqueous hydrochloric acid (HCl) solution, an aqueous sulfuric acid (H2SO4) solution, etc. These can be alone or a mixture thereof.

Figure 3E:
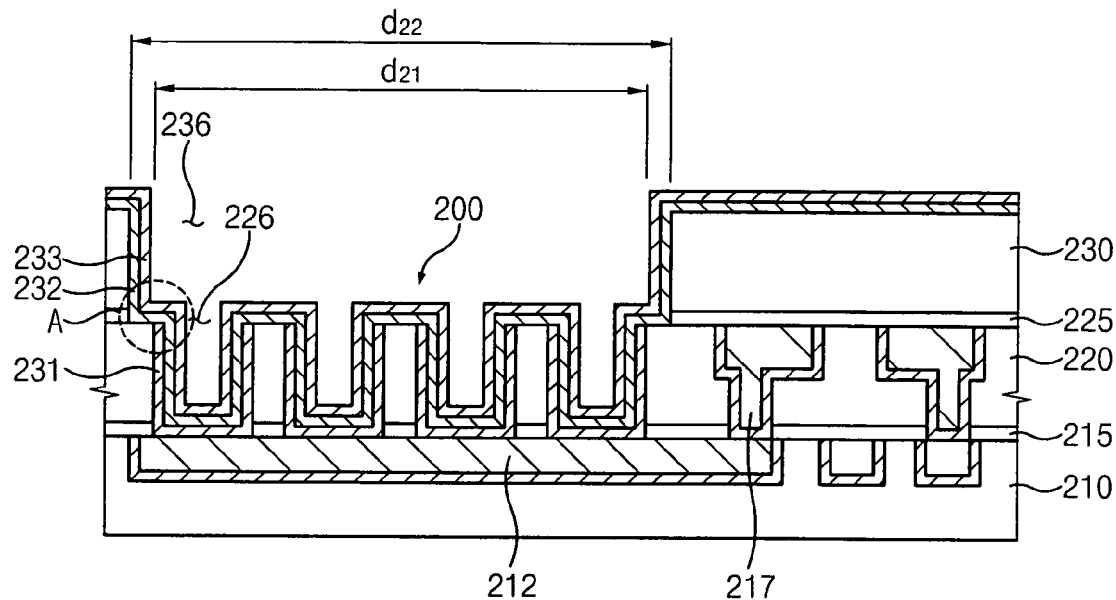

Referring to FIG. 3E, a dielectric layer 232 is formed on the second insulation layer 230 and a bottom of the second opening 236 corresponding to the stepped portion A, along a sidewall of the second opening 236, and along the lower electrode 231 in the first opening 226, so that the lower electrode 231 is sufficiently covered with the dielectric layer 232. Then, an upper electrode layer 233 is formed along the dielectric layer 232 in the first and the second openings 226 and 236.

The dielectric layer 232 comprises a material of a high dielectric constant, and the upper electrode 233 comprises a metal. Examples of the dielectric layer 232 include a silicon layer, a hafnium layer, an aluminum oxide layer or a composite layer thereof. Examples of a metal or a metal compound for the upper electrode 233 include tantalum (Ta), tantalum nitride (TaN), chrome (Cr), chrome nitride (CrN), titanium (Ti), titanium nitride (TiN), tungsten (W), tungsten nitride (WN), etc. These may be used alone or in combinations thereof. The upper electrode 233 is not always the same as the lower electrode 231 in terms of its composition material.

As a result, a capacitor 200 for a semiconductor device according to the second embodiment is formed to have the lower electrode 231, the dielectric layer 232 and the upper electrode 233 through the above processes. An end portion of the upper electrode 233 is spaced apart from an end portion of the lower electrode 231 at least by a height of the second insulation layer 230, so that the leakage current between the lower electrode 231 and the upper electrode 233 is sufficiently prevented in the capacitor 200.

Figure 3F:
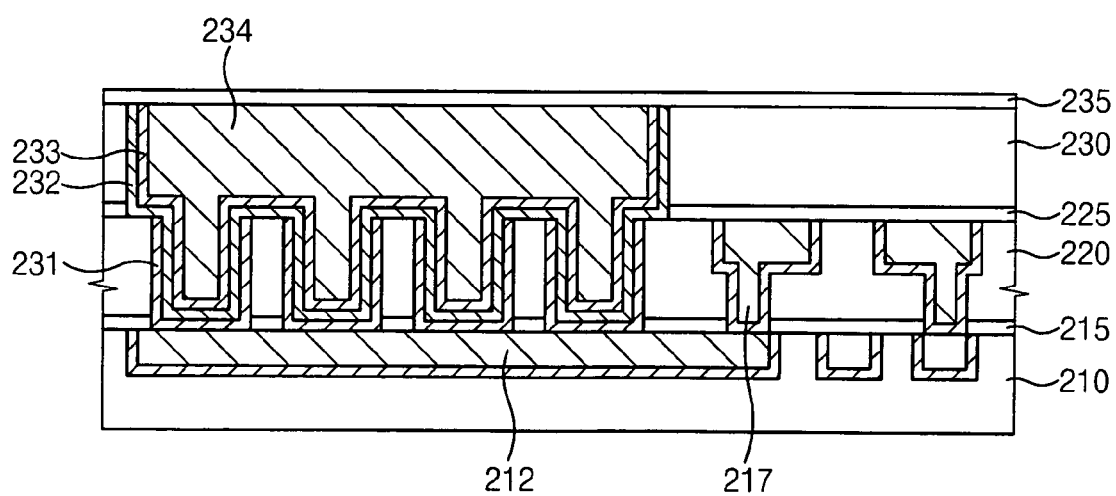

Referring to FIG. 3F, a second conductive material is coated onto the upper electrode 233 to a sufficient thickness to fill up the first and the second openings 226 and 236 to thereby form a second conductive layer (not shown) on the upper electrode layer 233. Then, the second conductive layer is removed and planarized until a top surface of the second insulation layer 230 is exposed, so that the dielectric layer 232, the upper electrode layer 233 and the second conductive layer remain only in the first and the second openings 226 and 236. As a result, the dielectric layer 232 and the upper electrode 233 are formed along an inner profile of the first and the second openings 226 and 236, and the first and second openings 226 and 236 are filled with a 5 conductive pattern 234. Then, a third etching stop layer 235 is formed on the conductive pattern 234 and the second insulation layer 230 for terminating an etching process in a subsequent process. Examples of the third etching stop layer 235 include a silicon nitride (SiN) layer, a silicon carbide (SiC) layer, a silicon carbon nitride (SiCN) layer, etc. They can be alone or in a mixture thereof.

Figure 3G:
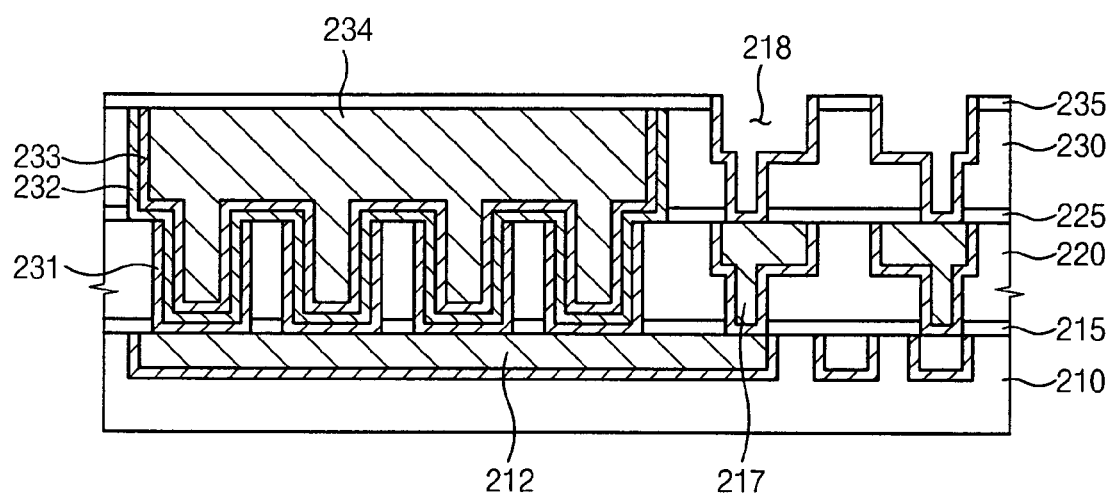
Figure 3H:
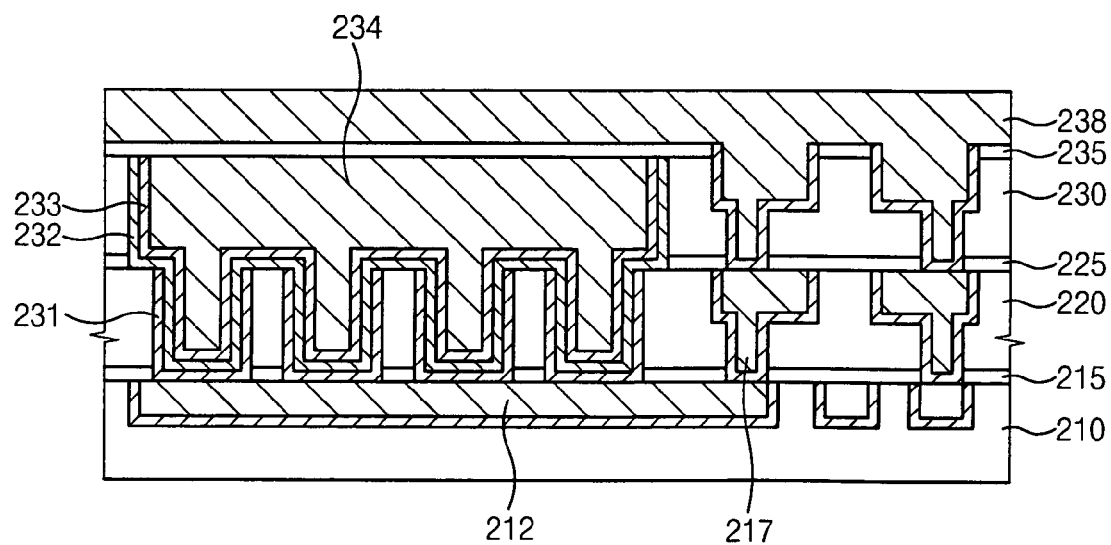
Figure 31:
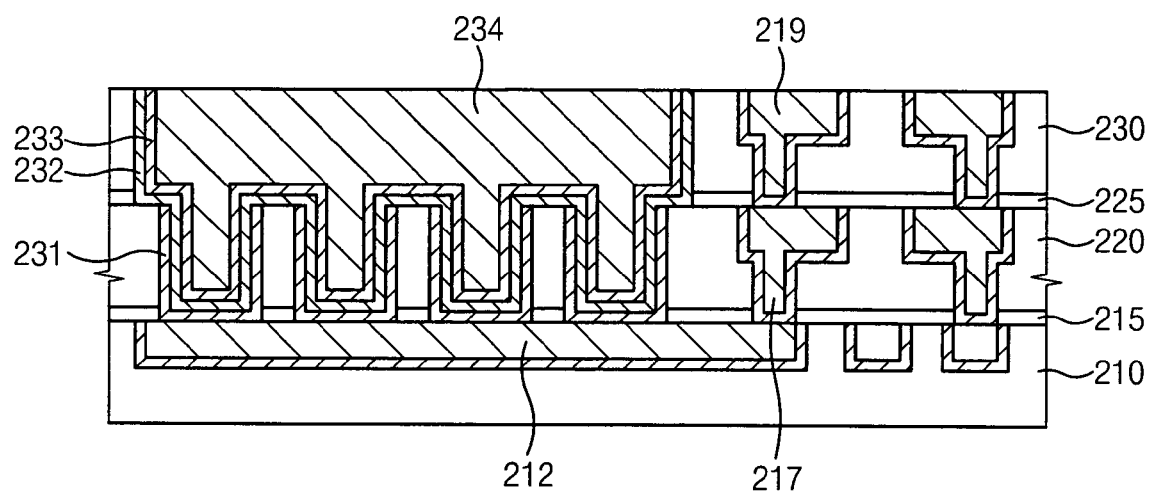

Referring to FIGS. 3G to 3I, the third etching stop layer 235 and the second insulation layer 230 are partially etched to thereby form a third wiring opening 218 through which a top surface of the second lower wiring 217 is exposed by the same process as the second wiring opening 216. In addition, a diffusion barrier layer is also formed along the sidewall and a bottom of the third wiring opening 218 by the same method as the diffusion barrier layer in the second wiring opening 216. Then, a third conductive material is coated on the third etching stop layer 235 and the diffusion barrier layer in the third wiring opening 218 to a sufficient thickness to fill up the third wiring opening 218 to thereby form a third conductive layer 238 on the third etching stop layer 235 Then, the third conductive layer 238 is removed and planarized until a top surface of the second insulation layer 230 is exposed, so that the third conductive layer 238 remains only in the third wiring opening 218 to thereby form a third lower wiring 219. An upper wiring (not shown) for applying an electric field to the upper electrode 233 is formed by the same process as described in Embodiment 1, so any further detailed description will be omitted to avoid redundancy.

According to the present embodiment, a lower electrode 231 of the capacitor 200 is formed to have a plurality of protruding portions, so that a capacitance of the capacitor 200 is remarkably increased. In addition, an end portion of the upper electrode 233 is spaced apart from an end portion of the lower electrode 231 at least by a height of the second insulation layer 230, so that the leakage current between the lower electrode 231 and the upper electrode 233 is sufficiently prevented in the capacitor 200. Further, the second wiring opening. 216 is simultaneously formed when the first opening 226 is formed, so that the processing time and cost for a semiconductor device are remarkably reduced. In particular, the second and the third lower wirings 217 and 219 may be formed regardless of an etching selectivity of the first and second insulation layers 220 and 230, so that the second and the third lower wirings 217 and 219 are easily formed as compared with Embodiment 1.

Embodiment 3

FIGS. 4A to 4I are views illustrating processing steps for a method of manufacturing a semiconductor device according to a third exemplary embodiment of the present invention.

Figure 4A:
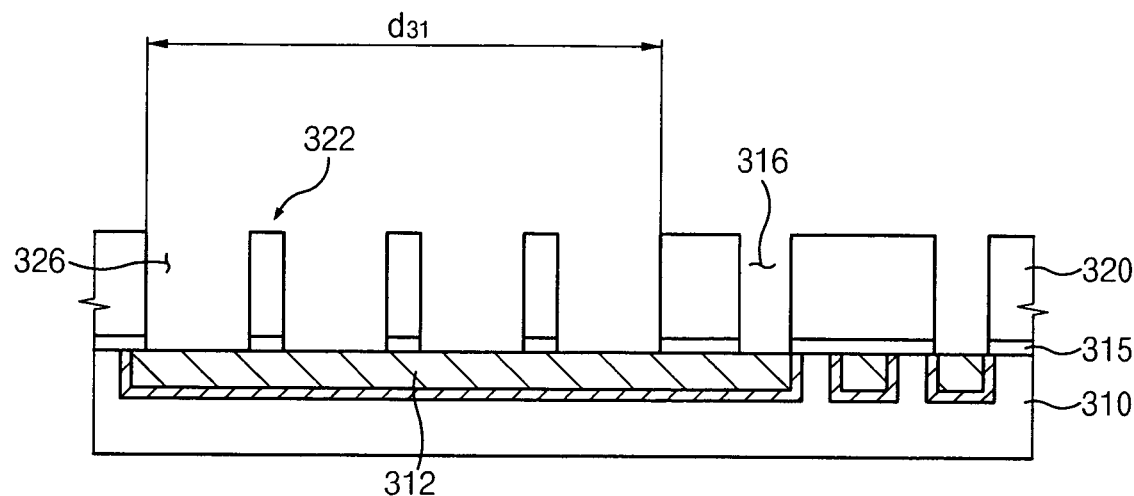

Referring to FIG. 4A, a lower insulation layer 310, a first lower wiring 312, a first etching stop layer 315, a first insulation layer 320 and a plurality of protruding portions 322 are substantially identical to those of Embodiment 2, and thus detailed description of those elements will not be repeated.

A first opening 326 having a first width $d_{31}$ is formed simultaneously when a second wiring opening 316 with a second lower wiring 317 is formed. The first insulation layer 320 and the first etching stop layer 315 are etched to thereby form the second wiring opening 316 through which a top surface of the first lower wiring 312 is exposed. In the present embodiment, the second wiring opening 316 is formed through a single damascene process.

Figure 4B:
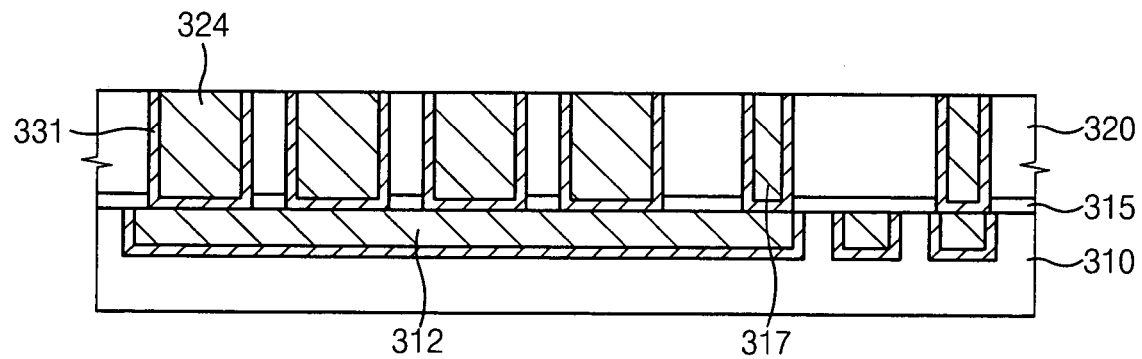

Referring to FIG. 4B, a lower electrode 331 is formed on a sidewall and a bottom of the first opening 326 at a predetermined height. In such a case, the lower electrode 331 is also formed on a sidewall and a bottom of the second wiring opening 316. A first conductive material is coated onto the first insulation layer 320 including the lower electrode 331 to a sufficient thickness to fill up the first opening 326 and the second wiring opening 316 to thereby form a first conductive layer (not shown) on the first insulation layer 320. Then, the first conductive layer is removed and planarized until a top surface of the first insulation layer 320 is exposed, so that the lower electrode 331 and the first conductive layer remain only in the first opening 326 and in the second wiring opening 316. As a result, the lower electrode 331 is formed along sidewalls and bottoms of the first opening 326 and a dummy layer 324 is formed on the lower electrode 331 in the first opening 326. In the same way, the first conductive layer is transformed into a second lower wiring 317 in the second wiring opening 316. In the present embodiment, the first conductive layer comprises the copper (Cu) or a compound thereof rather than the aluminum (Al) since the copper (Cu) has a lower specific resistance than the aluminum (Al).

Figure 4C:
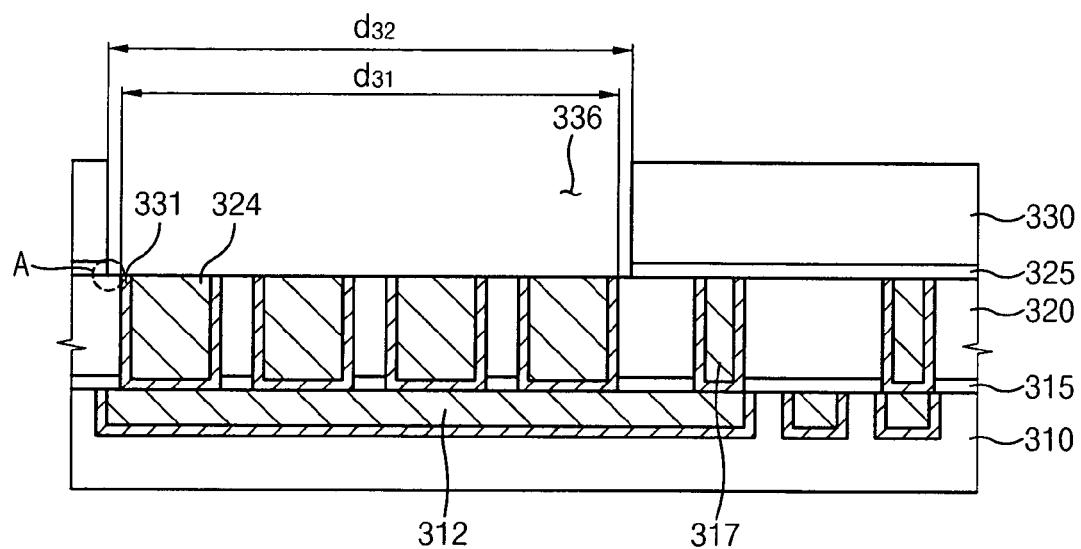
Figure 4D:
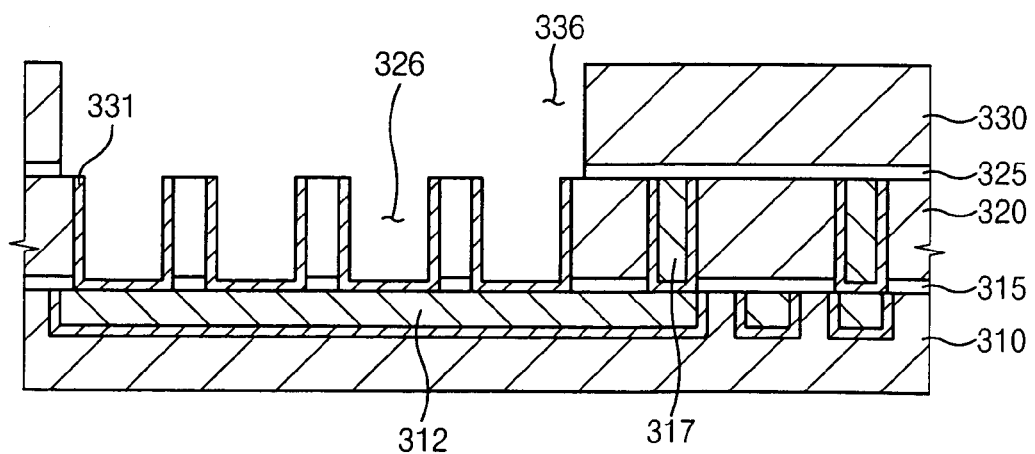

Referring to FIGS. 4C and 4D, a second etching stop layer 325 and a second insulation layer 330 are sequentially formed on the first insulation layer 320, the dummy layer 324 and the second lower wiring 317. Then, the second insulation layer 330 and the second etching stop layer 325 are sequentially and partially removed to thereby form a second opening 336 having a second width $d_{32}$ greater than the first width $d_{31}$ of the first opening 326, so that the dummy layer 324 and the lower electrode 331 are sufficiently exposed through the second opening 336. That is, a stepped portion A is formed between the first opening 326 and the second opening 336 due to the width difference of the first and second openings 326 and 336. In such a case, the second lower wiring 317 is still covered with the second etching stop layer 325 and the second insulation layer 330.

Then, the exposed dummy layer 324 is removed by a wet etching process; thus; the lower electrode 331 in the first opening 326 is exposed to surroundings.

Figure 4E:
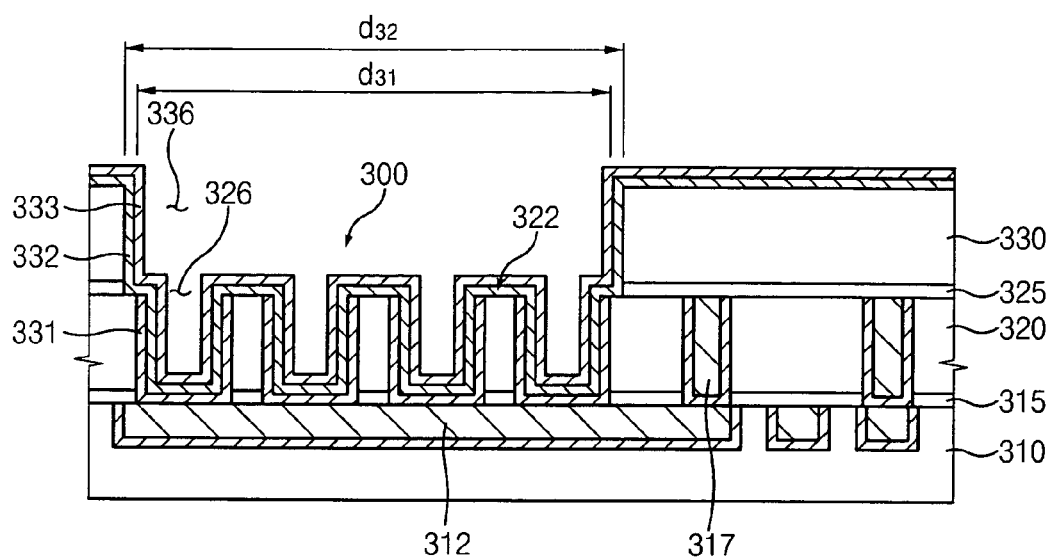

Referring to FIG. 4E, a dielectric layer 332 is formed on the second insulation layer 330 and a bottom of the second opening 336 corresponding to the stepped portion A, along a sidewall of the second opening 336, and along the lower electrode 331 in the first opening 326, so that the lower electrode 331 is sufficiently covered with the dielectric layer 332. Then, an upper electrode layer 333 is formed along the dielectric layer 332 in the first and the second openings 326 and 336.

As a result, a capacitor 300 for a semiconductor device according to the third embodiment is formed to have the lower electrode 331, the dielectric layer 332 and the upper electrode 333 through the above processes. An end portion of the upper electrode 333 is spaced apart from an end portion of the lower electrode 331 at least by a height of the second insulation layer 330, so that the leakage current between the lower electrode 331 and the upper electrode 333 is sufficiently prevented in the capacitor 300.

Figure 4F:
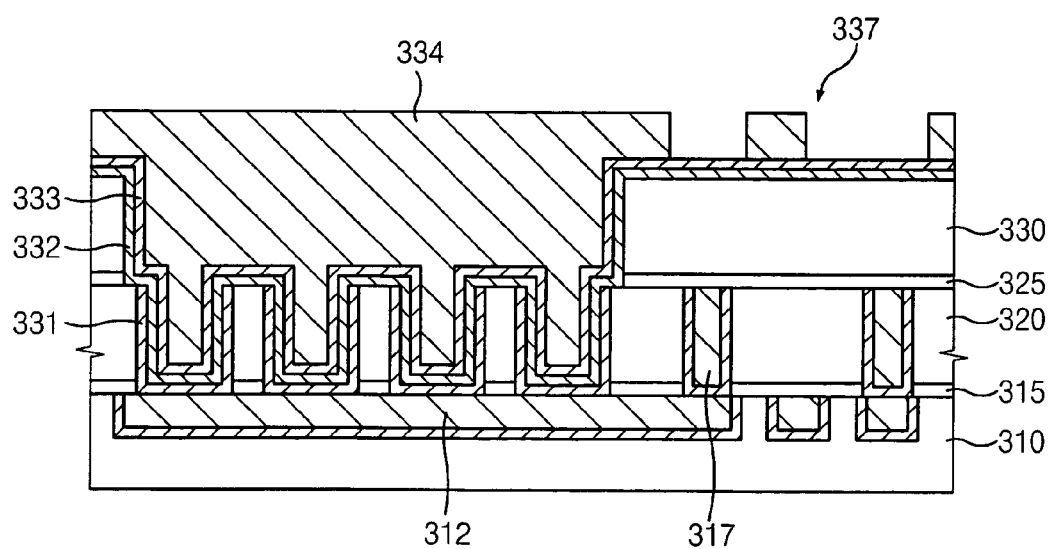
Figure 4G:
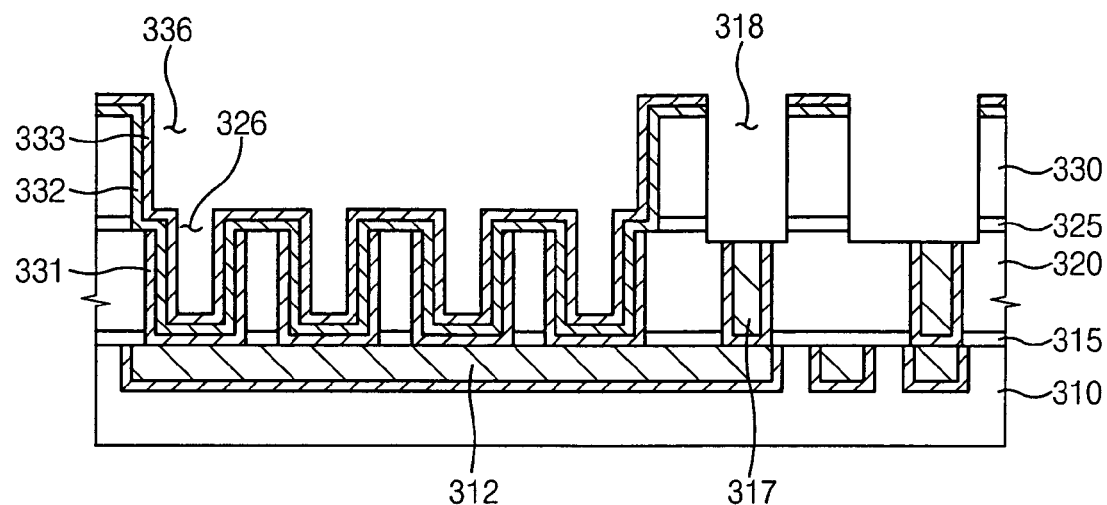

Referring to FIGS. 4F and 4G, a second conductive material is coated onto the upper electrode 333 to a sufficient thickness to fill up the first and the second openings 326 and 336 to thereby form a second conductive layer 334 on the upper electrode layer 333. Then, the second conductive layer 334 is planarized to a predetermined height from the upper electrode 333, and is partially removed correspondently to the second lower wiring 317 to thereby form a local pattern 337 over the second insulation layer 330. The upper electrode 333, the dielectric layer 332, the second insulation layer 330 and the second etching stop layer 325 are sequentially and partially etched using the local pattern 337 as an etching mask to thereby form a third wiring opening 318 through which a top surface of the second lower wiring 317 is exposed. The second conductive layer 334 and the local pattern 337 are sufficiently removed from the upper electrode 333 by a wet etching process.

Figure 4H:
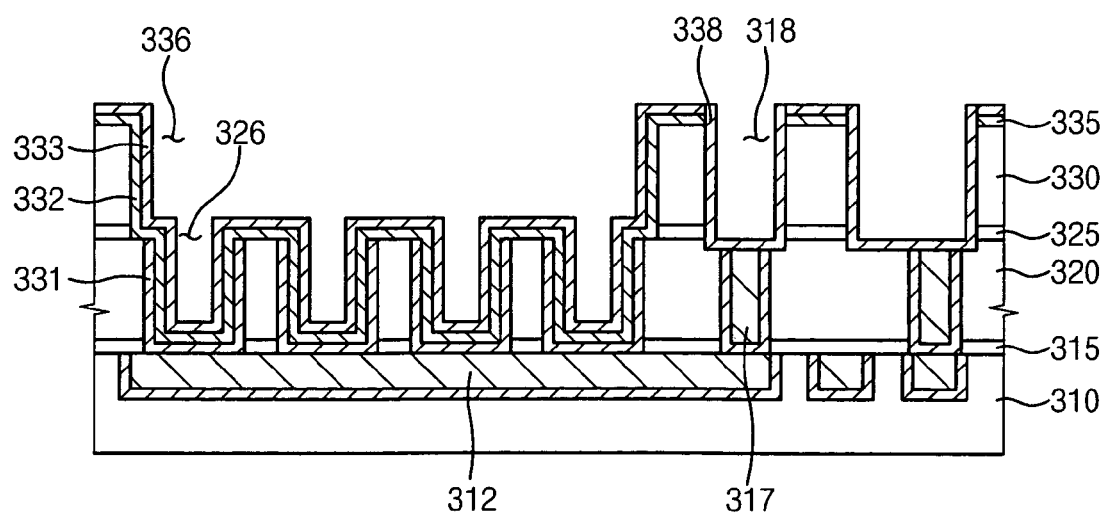
Figure 41:
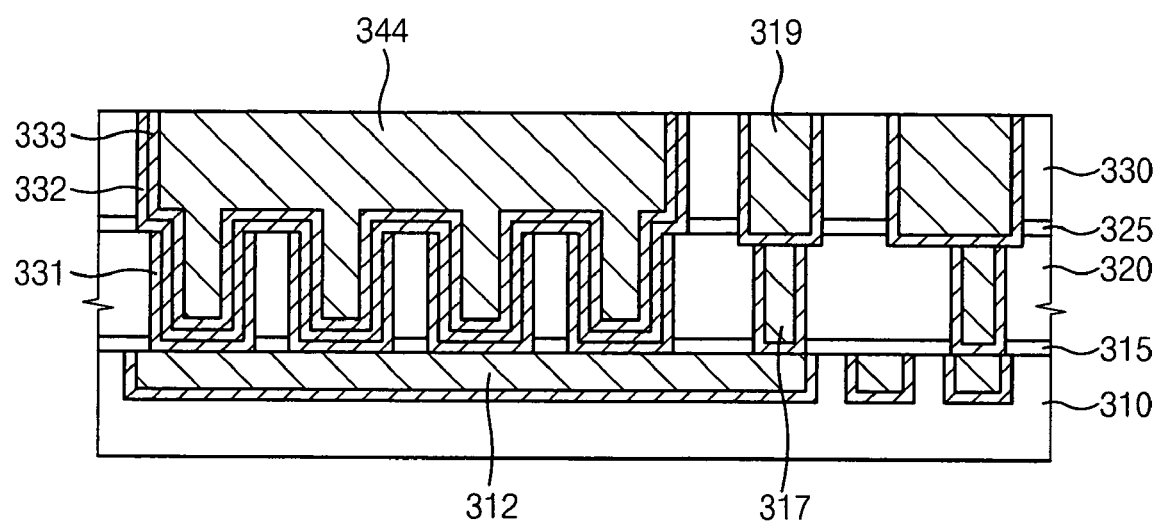

Referring to FIGS. 4H to 4I, a diffusion barrier layer 338 is formed on a sidewall and a bottom of the third wiring opening 318. In the present embodiment, the diffusion barrier layer 338 comprises a material having the same property as the upper electrode 333. Then, a third conductive material is coated on the upper electrode 333 and the diffusion barrier layer 338 to a sufficient thickness to fill up the first and second openings 326 and 336 and the third wiring opening 318 to thereby form a third conductive layer (not shown). The third conductive layer is removed and planarized until a top surface of the second insulation layer 330 is exposed, so that the third conductive layer remains only in the first and second openings 326 and 336 and the third wiring opening 318 to thereby be separated into a conductive pattern 344 in the first and second openings 326 and 336 and a third lower wiring 319 in the third wiring opening 318.

An upper wiring (not shown) for applying an electric field to the upper electrode 333 is formed by the same process as described in Embodiment 1, so any further detailed description will be omitted to avoid a redundancy.

According to the present embodiment, the second and the third lower wirings 317 and 319 are relatively easily formed through the single damascene process as compared with Embodiments 1 and 2, so that a capacitance of the capacitor 300 is remarkably increased. In addition, an end portion of the upper electrode 333 is spaced apart from an end portion of the lower electrode 331 at least by a height of the second insulation layer 330, so that the leakage current between the lower electrode 331 and the upper electrode 333 is sufficiently suppressed in the capacitor 300.

Embodiment 4

FIGS. 5A to 5I are views illustrating processing steps for a method of manufacturing a semiconductor device according to a fourth exemplary embodiment of the present invention.

Figure 5A:
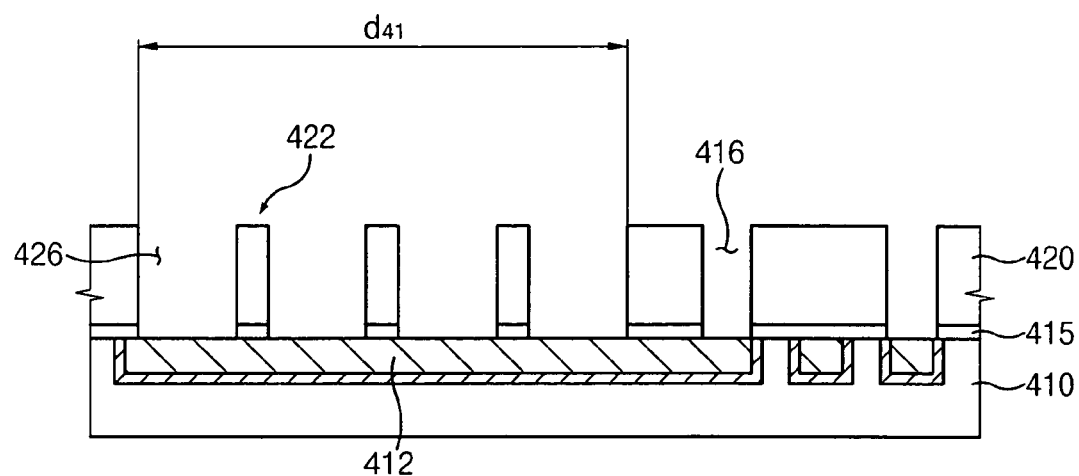

Referring to FIG. 5A, a lower insulation layer 410, a first lower wiring 412, a first etching stop layer 415, a first insulation layer 420, a first opening 426, a second opening 436, a plurality of protruding portions 422 in the first opening 426 and a second wiring opening 416 are substantially identical to those of Embodiment 3, and thus detailed descriptions of those elements will not be repeated.

Figure 5B:
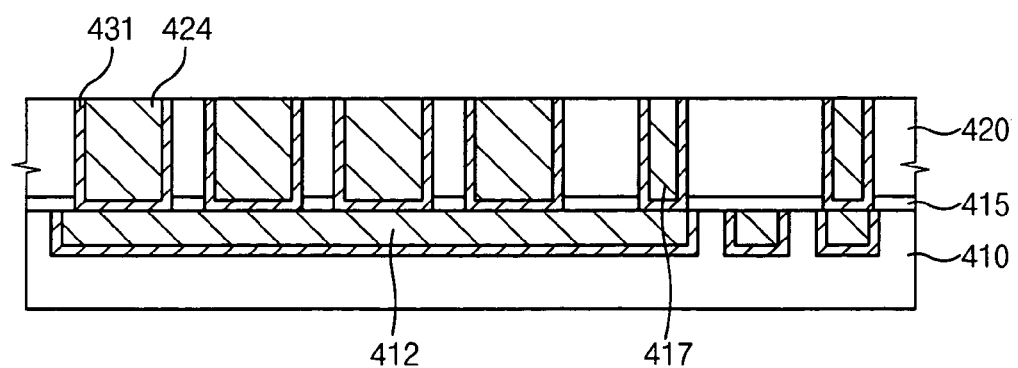

Referring to FIG. 5B, a lower electrode 431 is formed on a sidewall and a bottom of the first opening 426 at a predetermined height. In such a case, the lower electrode 431 is also formed on a sidewall and a bottom of the second wiring opening 416. A first conductive material is coated onto the first insulation layer 420 including the lower electrode 431 to a sufficient thickness to fill up the first opening 426 and the second wiring opening 416 to thereby form a first conductive layer (not shown) on the first insulation layer 420. Then, the first conductive layer is removed and planarized until a top surface of the first insulation layer 420 is exposed, so that the lower electrode 431 and the first conductive layer remain only in the first opening 426 and in the second wiring opening 416. As a result, the lower electrode 431 is formed along sidewalls and bottoms of the first opening 426 and a dummy layer 424 is formed on the lower electrode 431 in the first opening 426. In the same way, the first conductive layer is transformed into a second lower wiring 417 in the second wiring opening 416. In the present embodiment, the first conductive layer comprises the copper (Cu) or a compound thereof rather than the aluminum (Al) since the copper (Cu) has a lower specific resistance than the aluminum (Al).

Figure 5C:
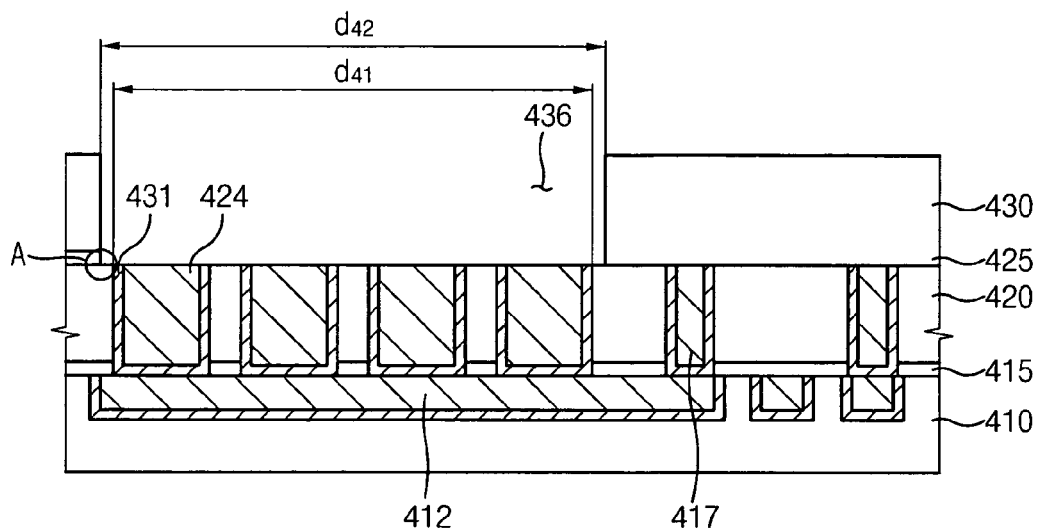
Figure 5D:
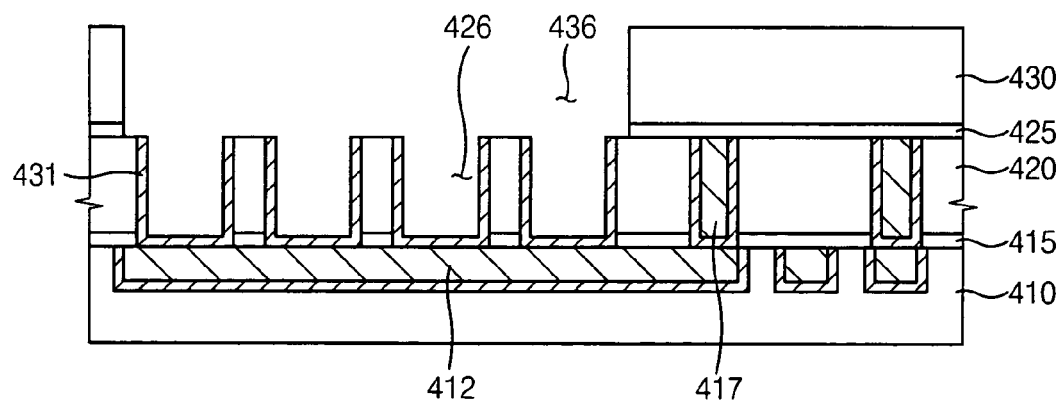

Referring to FIGS. 5C and 5D, a second etching stop layer 425 and a second insulation layer 430 are sequentially formed on the first insulation layer 420, the dummy layer 424 and the second lower wiring 417. Then, the second insulation layer 430 and the second etching stop layer 425 are sequentially and partially removed to thereby form a second opening 436 having a second width $d_{42}$ greater than a first width $d_{41}$ of the first opening 426, so that the dummy layer 424 and the lower electrode 431 are sufficiently exposed through the second opening 436. That is, a stepped portion A is formed between the first opening 426 and the second opening 436 due to the width difference of the first and second openings 426 and 436.

At that time, the second lower wiring 417 is still covered with the second etching stop layer 425 and the second insulation layer 430.

Then, the exposed dummy layer 424 is removed by a wet etching process; thus, the lower electrode 431 in the first opening 426 is exposed to surroundings.

Figure 5E:
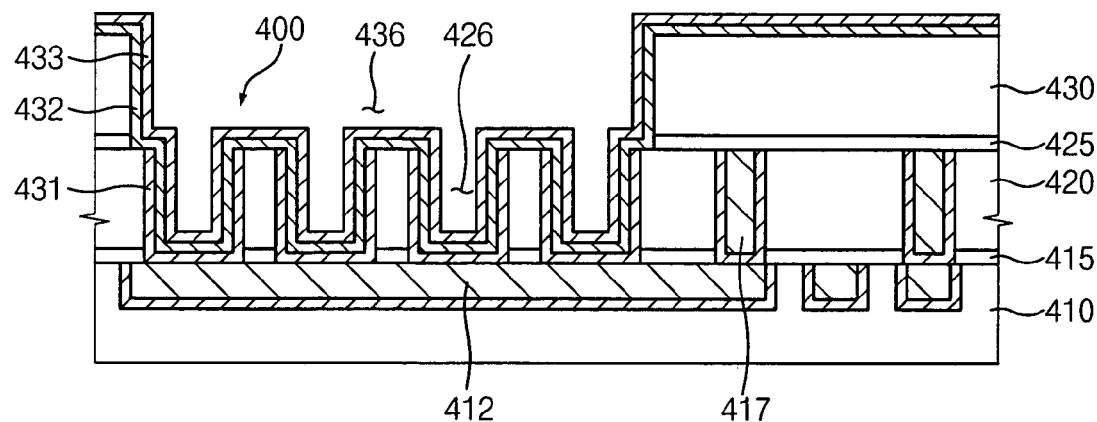

Referring to FIG. 5E, a dielectric layer 432 is formed on the second insulation layer 430 and a bottom of the second opening 436 corresponding to the stepped portion A, along a sidewall of the second opening 436, and along the lower electrode 431 in the first opening 426, so that the lower electrode 431 is sufficiently covered with the dielectric layer 432. Then, an upper electrode layer 433 is formed along the dielectric layer 432 in the first and the second openings 426 and 436.

As a result, a capacitor 400 for a semiconductor device according to the fourth embodiment is formed to have the lower electrode 431, the dielectric layer 432 and the upper electrode 433 through the above processes. An end portion of the upper electrode 433 is spaced apart from an end portion of the lower electrode 431 at least by a height of the second insulation layer 430, so that the leakage current between the lower electrode 431 and the upper electrode 433 is sufficiently suppressed in the capacitor 400.

Figure 5F:
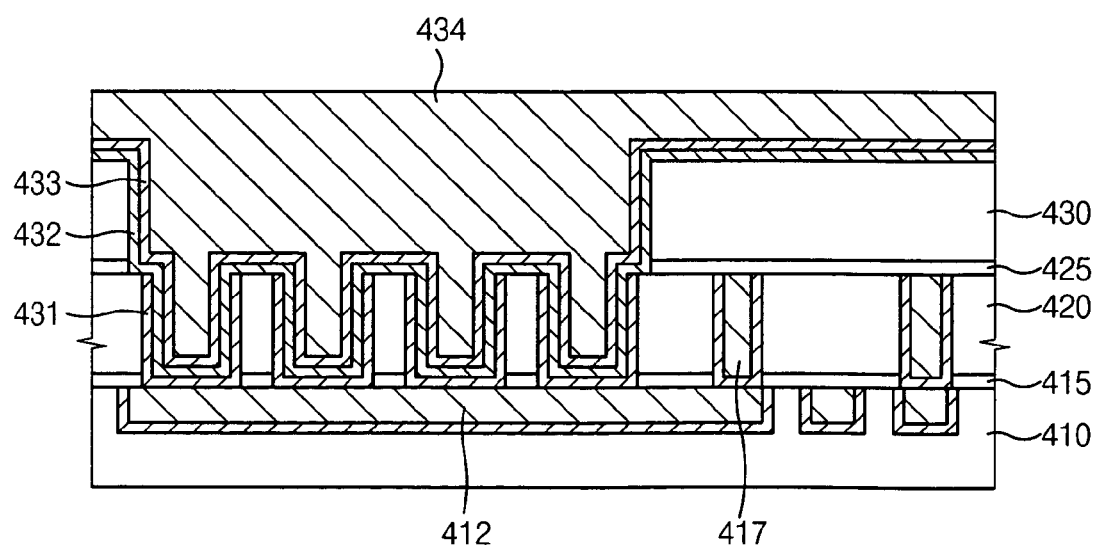
Figure 5G:
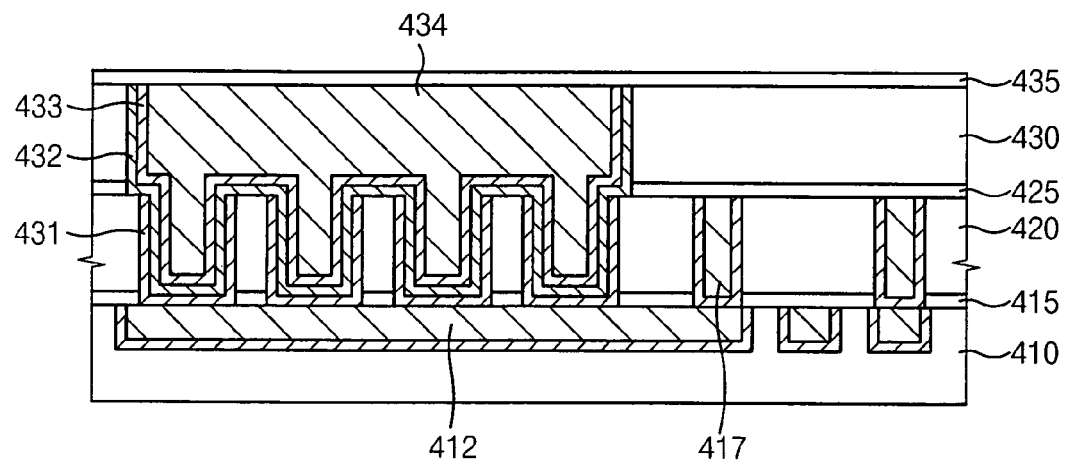

Referring to FIGS. 5F and 5G, a second conductive material is coated onto the upper electrode 433 to a sufficient thickness to fill up the first and the second openings 426 and 436 to thereby form a second conductive layer (not shown) on the upper electrode layer 433. Then, the second conductive layer is removed and planarized until a top surface of the second insulation layer 430 is exposed, so that the dielectric layer 432, the upper electrode layer 433 and the second conductive layer remain only in the first and the second openings 426 and 436. As a result, the dielectric layer 432 and the upper electrode 433 are formed along an inner profile of the first and the second openings 426 and 436, and the first and second openings 426 and 436 are filled with a conductive pattern 434. Then, a third etching stop layer 435 is formed on the conductive pattern 434 and the second insulation layer 430 for terminating an etching process in a subsequent process.

Figure 5H:
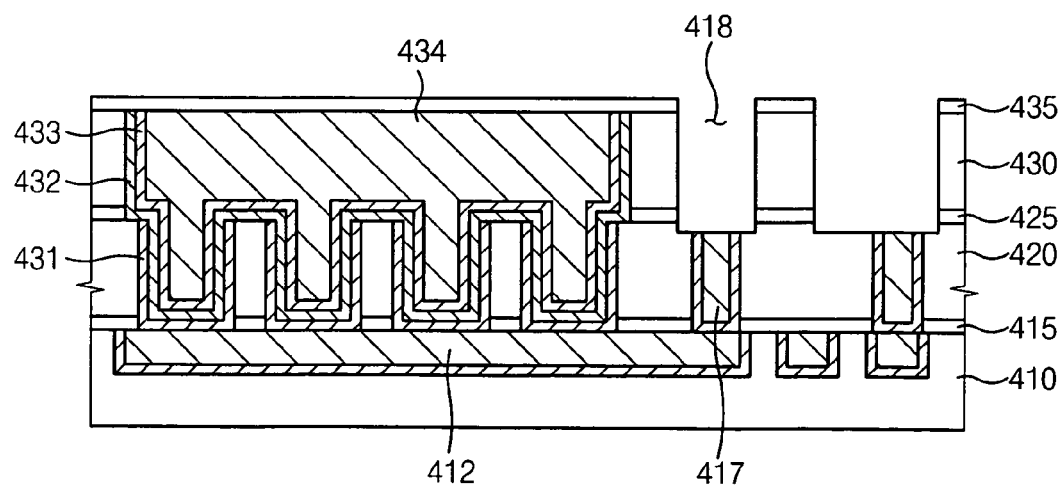
Figure 51:
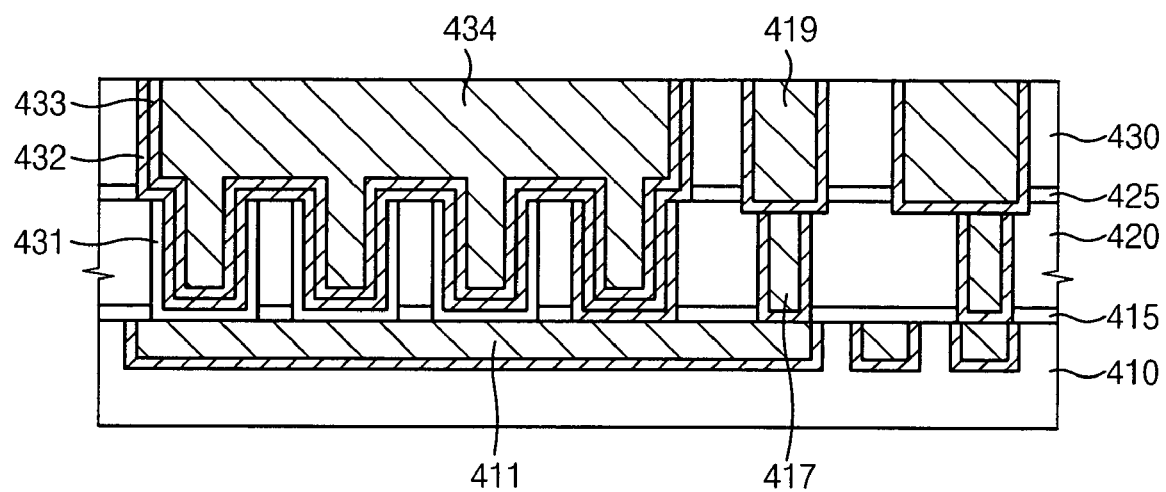

Referring to FIGS. 5H to 5I, the third etching stop layer 435, the second insulation layer 430 and the second etching stop layer 425 are sequentially and partially etched correspondently to the second lower wiring 417 to thereby form a third wiring opening 418 through which a top surface of the second lower wiring 417 is exposed. In the present embodiment, the third wiring opening 418 is formed through the same process as the second wiring opening 416. Then, a diffusion barrier layer is formed on a sidewall and a bottom of the third wiring opening 418. In the present embodiment, the diffusion barrier layer comprises a material having the same property as the upper electrode 433. A third conductive material is coated on the third etching stop layer 435 and the diffusion barrier layer to a sufficient thickness to fill up the third wiring opening 418 to thereby form a third conductive layer (not shown). The third conductive layer and the third etching stop layer 435 are removed and planairzed until a top surface of the second insulation layer 430 is exposed, so that the third conductive layer remains only in the third wiring opening 418 to thereby form a third lower wiring 419 in the third wiring opening 418.

According to the present embodiment, the conductive material is coated on the upper electrode 433 just once while coated on the upper electrode 333 twice in Embodiment 3, so that the upper electrode 433 is relatively more prevented from being damaged during the coating process of the conductive material than in Embodiment 3. As a result, the capacitor 400 of the present embodiment is more stable in operation than the capacitor 300 according to Embodiment 3. In addition, a capacitance of the capacitor 400 is remarkably increased, and the leakage current between the lower electrode 431 and the upper electrode 433 is sufficiently suppressed in the capacitor 400.

Embodiment 5

FIGS. 2E and 2G are cross sectional views illustrating a semiconductor device according to a fifth embodiment of the present invention.

Referring to FIGS. 2E and 2G, the semiconductor device according to the fifth embodiment of the present invention includes a lower electrode 131, a dielectric layer 132 and an upper electrode 133.

A first etching stop layer 115, a first insulation layer 120, a second etching stop layer 125, a second insulation layer 130, a third etching stop layer 135, a third insulation layer 140, a fourth etching stop layer 145, and a fourth insulation layer 150 are sequentially formed on a lower insulation layer 110 including a first lower wiring 112. A first opening 126 having a first width $d_{11}$ is formed through the first insulation layer 120 and the first etching stop layer 115, and a second opening 136 having a second width $d_{12}$ greater than the first width $d_{11}$ is formed through the second insulation layer 130 and the second etching stop layer 125. The second opening 136 is continuously connected to the first opening 126, so that a first stepped portion A is formed between the first and second openings 126 and 136 due to the width difference therebetween. In addition, a third opening 146 having a third width $d_{13}$ greater than the second width $d_{12}$ is formed through the third insulation layer 140 and the third etching stop layer 135. The third opening 146 is continuously connected to the second opening 136, so that a second stepped portion B is formed between the second and third openings 136 and 146 due to the width difference therebetween. As a result, a top surface of the first lower wiring 112 is exposed through the first, the second and the third openings 126, 136 and 146 to surroundings.

In the present embodiment, the second width $d_{12}$ is formed to be about 5000 Å, and the first and third widths $d_{11}$ and $d_{13}$ are determined in accordance with the second width $d_{12}$. In addition, the first, second, third and fourth etching stop layers 115, 125, 135 and 145 include a material having an etching selectivity to a silicon oxide. In particular, the material for the fourth etching stop layer 145 includes silicon nitride (SiN), silicon carbide (SiC) or silicon carbon nitride (SiCN). In one embodiment, the first, second, third and fourth etching stop layers 115, 125, 135 and 145 are the same material.

The lower electrode 131 is formed along an inner contour of the first and second openings 126 and 136, so that the first lower wiring 112 makes contact with the lower electrode 131 at a bottom of the first opening 126. Then, the dielectric layer 132 is formed along an inner contour of the first, second and third openings 126, 136 and 146, so that the lower electrode 131 is covered with the dielectric layer 132. The upper electrode 133 is formed on the dielectric layer 132 along the inner contour of the first, second and third openings 126, 136 and 146. As a result, a capacitor 100 is formed to have the lower electrode 131, the dielectric layer 132 and the upper electrode 133. An end portion of the upper electrode 133 is spaced apart from an end portion of the lower electrode 131 at least by a height of the third insulation layer 140, so that the leakage current between the lower electrode 131 and the upper electrode 133 is sufficiently suppressed in the capacitor 100.

The lower electrode 131 and the upper electrode 133 may comprise a metal or a metal compound. Examples of the metal or the metal compound for the lower and upper electrodes 131 and 133 include tantalum (Ta), tantalum nitride (TaN), chrome (Cr), chrome nitride (CrN), titanium (Ti), titanium nitride (TiN), tungsten (W), tungsten nitride (WN), etc. These may be used alone or in combinations thereof. The lower and upper electrodes 131 and 133 are not always the same material. The dielectric layer 132 comprises a material of a high dielectric constant. Examples of the dielectric layer 132 include a silicon layer, a hafnium layer, an aluminum oxide layer or a composite layer thereof.

A second lower wiring 117 and a third lower wiring 119 are vertically formed through the etching stop layers and the insulation layers adjacent to the capacitor 100, so that an electric field is applied to the lower electrode 131 through the first lower wiring 112 by the second and third lower wirings 117 and 119. In detail, the second lower wiring 117 is formed through the second insulation layer 130, the second etching stop layer 125 and the first insulation layer 120, and makes contact with the first lower wiring 112 via the medium of a diffusion barrier layer. The third lower wiring 119 is formed through the fourth insulation layer 150, the fourth etching stop layer 145 and the third insulation layer 140, and makes contact with the second lower wiring 117 via the medium of a diffusion barrier layer. In the present embodiment, the second and third lower wirings 117 and 119 have a dual damascene pattern, respectively.

The dual damascene pattern includes a via-hole and a trench that are consecutively connected to each other. In the second and third lower wirings 117 and 119, a priority between the via-hole and the trench and a size of the via-hole and the trench are determined in accordance with an allowable range of a misalignment for the via-hole and the trench.

An upper wiring 155 for applying an electric field to the upper electrode 133 is formed through the fourth insulation layer 150. In detail, the first, second and third openings 126, 136 and 146 are filled with a conductive material to thereby form a conductive layer 134 making contact with the upper electrode 133. The upper wiring 155 makes electrical contact with the conductive layer 134 through the fourth insulation layer 150. That is, the upper wiring 155 applies an electric field to the upper electrode 133 via the medium of the conductive layer 134. The conductive layer 134 comprises a metal of a low specific resistance such as aluminum (Al) or copper (Cu). In the present embodiment, the conductive layer 134 comprises the copper (Cu) or a compound thereof rather than the aluminum (Al) since the copper (Cu) has a lower specific resistance than the aluminum (Al).

A plurality of protruding portions 122 may be formed on the bottom of the first opening 126 for increasing a capacitance of the semiconductor device. In the semiconductor device, the higher the protruding portion 122 is, the greater the capacitance is; thus, the protruding portion 122 is formed to have a height substantially identical to a depth of the first opening 126.

According to the present embodiment, an effective surface of the lower electrode 131 is relatively enlarged due to the protruding portions 122, so that a capacitance of the capacitor 100 is remarkably increased. In addition, an end portion of the upper electrode 133 is spaced apart from an end portion of the lower electrode 131 at least by a height of the third insulation layer 140, so that the leakage current between the lower electrode 131 and the upper electrode 133 is sufficiently suppressed in the capacitor 100.

Embodiment 6

FIGS. 3E and 3I are cross sectional views illustrating a semiconductor device according to a sixth embodiment of the present invention.

Referring to FIGS. 3E and 3I, the semiconductor device according to the sixth embodiment of the present invention includes a lower electrode 231, a dielectric layer 232 and an upper electrode 233.

A first etching stop layer 215, a first insulation layer 220, a second etching stop layer 225 and a second insulation layer 230 are sequentially formed on a lower insulation layer 210 including a first lower wiring 212. A first opening 226 having a first width $d_{21}$ is formed through the first insulation layer 220 and the first etching stop layer 215, and a second opening 236 having a second width $d_{22}$ greater than the first width $d_{21}$ is formed through the second insulation layer 230 and the second etching stop layer 225. The second opening 236 is continuously connected to the first opening 226, so that a first stepped portion A is formed between the first and second openings 226 and 236 due to the width difference therebetween. As a result, a top surface of the first lower wiring 212 is exposed through the first and the second openings 226 and 236 to surroundings.

In the present embodiment, the second width $d_{22}$ is formed to be no less than about 5000 Å, and the first width $d_{21}$ is determined in accordance with the second width $d_{22}$.

The lower electrode 231 is formed along an inner contour of the first opening 226, so that the first lower wiring 212 makes contact with the lower electrode 231 at a bottom of the first opening 226. Then, the dielectric layer 232 is formed along an inner contour of the first and second openings 226 and 236, so that the lower electrode 231 is covered with the dielectric layer 232. The upper electrode 233 is formed on the dielectric layer 232 along the inner contour of the first and second openings 226 and 236. As a result, a capacitor 200 is formed to have the lower electrode 231, the dielectric layer 232 and the upper electrode 233. An end portion of the upper electrode 233 is spaced apart from an end portion of the lower electrode 231 at least by a height of the second insulation layer 230, so that the leakage current between the lower electrode 231 and the upper electrode 233 is sufficiently prevented in the capacitor 200.

The lower electrode 231 and the upper electrode 233 may comprise a metal or a metal compound. Examples of the metal or metal compound for the lower and upper electrodes 231 and 233 include tantalum (Ta), tantalum nitride (TaN), chrome (Cr), chrome nitride (CrN), titanium (Ti), titanium nitride (TiN), tungsten (W), tungsten nitride (WN), etc. These may be used alone or in combinations thereof. The lower and upper electrodes 231 and 233 are not always the same material. The dielectric layer 232 comprises a material of a high dielectric constant. Examples of the dielectric layer 232 include a silicon layer, a hafnium layer, an aluminum oxide layer or a composite layer thereof.

A second lower wiring 217 and a third lower wiring 219 are vertically formed through the etching stop layers and the insulation layers adjacent to the capacitor 200, so that an electric field is applied to the lower electrode 231 through the first lower wiring 212 by the second and third lower wirings 217 and 219. In detail, the second lower wiring 217 is formed through the first insulation layer 220 and the first etching stop layer 215, and makes contact with the first lower wiring 212 via the medium of a diffusion barrier layer. The third lower wiring 219 is formed through the second insulation layer 230 and the second etching stop layer 225, and makes contact with the second lower wiring 217 via the medium of a diffusion barrier layer. In the present embodiment, the second and third lower wirings 217 and 219 have a dual damascene pattern, respectively, and comprise a metal of a low specific resistance such as aluminum (Al) or copper (Cu). In the present embodiment, the second and third lower wirings 217 and 219 comprise the copper (Cu) or a compound thereof rather than the aluminum (Al) since the copper (Cu) has a lower specific resistance than the aluminum (Al).

The first and second openings 226 and 236 are filled with a conductive material to thereby form a conductive layer 234 making contact with the upper electrode 233. An upper wiring (not shown) for applying an electric field to the upper electrode 233 makes electrical contact with the conductive layer 234. That is, the upper wiring applies an electric field to the upper electrode 233 via the medium of the conductive layer 234. The conductive layer 234 comprises a metal of a low specific resistance such as aluminum (Al) or copper (Cu). In the present embodiment, the second and third lower wirings 217 and 219 comprise the copper (Cu) or a compound thereof rather than the aluminum (Al) since the copper (Cu) has a lower specific resistance than the aluminum (Al).

A plurality of protruding portions 222 may be formed on the bottom of the first opening 226 for increasing a capacitance of the semiconductor device. In the semiconductor device, the protruding portion 222 is formed to have a height substantially identical to a depth of the first opening 226.

According to the present embodiment, an effective surface of the lower electrode 231 is relatively enlarged due to the protruding portions 222, so that a capacitance of the capacitor 200 is remarkably increased. In addition, an end portion of the upper electrode 233 is spaced apart from an end portion of the lower electrode 231 at least by a height of the second insulation layer 230, so that the leakage current between the lower electrode 231 and the upper electrode 233 is sufficiently suppressed in the capacitor 200.

Embodiment 7

FIGS. 4E and 4I are cross sectional views illustrating a semiconductor device according to a seventh embodiment of the present invention.

As shown in FIGS. 4E and 4I, the semiconductor device according to the seventh embodiment of the present invention is the same as Embodiment 6 except for a second lower wiring 317 and a third lower wiring 319; thus, the second and third lower wirings 317 and 319 are intensively described in detail below.

The second lower wiring 317 and the third lower wiring 319 are vertically formed through the etching stop layers and the insulation layers adjacent to the capacitor 300, so that an electric field is applied to the lower electrode 331 through the first lower wiring 312 by the second and third lower wirings 317 and 319. In detail, the second lower wiring 317 is formed through the first insulation layer 320 and the first etching stop layer 315, and makes contact with the first lower wiring 312 via the medium of a diffusion barrier layer. The third lower wiring 319 is formed through the second insulation layer 330 and the second etching stop layer 325, and makes contact with the second lower wiring 317 via the medium of a diffusion barrier layer. In the present embodiment, the second and third lower wirings 317 and 319 have a single damascene pattern, respectively, and comprise a metal of a low specific resistance such as aluminum (Al) or copper (Cu). In the present embodiment, the second and third lower wirings 317 and 319 comprise the copper (Cu) or a compound thereof rather than the aluminum (Al) since the copper (Cu) has a lower specific resistance than the aluminum (Al).

The first and second openings 326 and 336 are filled with a conductive material to thereby form a conductive layer 344 making contact with the upper electrode 333. An upper wiring (not shown) for applying an electric field to the upper electrode 333 makes electrical contact with the conductive layer 344. That is, the upper wiring applies an electric field to the upper electrode 333 via the medium of the conductive layer 344. The conductive layer 344 comprises a metal of a low specific resistance such as aluminum (Al) or copper (Cu). In the present embodiment, the second and third lower wiring 317 and 319 comprise the copper (Cu) or a compound thereof rather than the aluminum (Al) since the copper (Cu) has a lower specific resistance than the aluminum (Al).

A plurality of protruding portions 322 may be formed on the bottom of the first opening 326 for increasing a capacitance of the semiconductor device. In the semiconductor device, the protruding portion 322 is formed to have a height substantially identical to a depth of the first opening 326.

According to the present embodiment, an effective surface of the lower electrode 331 is relatively enlarged due to the protruding portions 322, so that a capacitance of the capacitor 300 is remarkably increased. In addition, an end portion of the upper electrode 333 is spaced apart from an end portion of the lower electrode 331 at least by a height of the second insulation layer 330, so that the leakage current between the lower electrode 331 and the upper electrode 333 is sufficiently prevented in the capacitor 300.

According to the present invention, an effective surface of the lower electrode is relatively enlarged since the lower electrode is formed along sidewalls of an opening for a capacitor and a plurality of protruding portions is formed on a bottom of the opening, so that a capacitance of the capacitor is remarkably increased. In addition, an end portion of the upper electrode is spaced apart from an end portion of the lower electrode by a predetermined distance, so that the leakage current between the lower electrode and the upper electrode is sufficiently prevented in the capacitor. Further, the opening for the capacitor and an opening for lower wirings are formed simultaneously with each other; thus, the processing time and cost for a semiconductor device are remarkably reduced.

Although the exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A semiconductor device including a capacitor, comprising:
   a lower electrode formed on a sidewall and a bottom of a first opening, a first insulation layer being patterned to a first width to thereby form the first opening;
   a dielectric layer formed along the lower electrode in the first opening and directly on a sidewall of a second opening, the dielectric layer contacting a second insulation layer on the first insulation layer and a first stepped portion between the first insulation layer and the second insulation layer, the second insulation layer being patterned to a second width greater than the first width to thereby form the second opening that is connected to the first opening with the first stepped portion; and
   an upper electrode formed on the dielectric layer.

2. The semiconductor device of claim 1, wherein the lower electrode is extended from a second stepped portion between the first insulation layer and a third insulation layer, the third insulation layer being under the first insulation layer, to a sidewall and a bottom of a third opening, the third insulation layer being patterned to a third width less than the first width to thereby form the third opening that is connected to the first opening with the second stepped portion.

3. The semiconductor device of claim 1, wherein the bottom of the first opening includes a plurality of protruding portions.

4. The semiconductor device of claim 1, wherein the lower electrode makes contact with a first lower wiring, and the first lower wiring makes contact with a second lower wiring vertically formed through the first and second insulation layers, so that an electric field is applied to the lower electrode via the first lower wiring by the second lower wiring.

5. The semiconductor device of claim 4, wherein the second lower wiring includes a via-hole and a trench that are consecutively connected with each other.

6. The semiconductor device of claim 1, wherein the lower and upper electrodes comprise a metal, a metal compound or a mixture thereof.

7. A method of manufacturing a semiconductor device, comprising:
   providing a substrate including a first opening having a first width, a second opening having a second width greater than the first width and connected to the first opening, and a lower electrode formed in the first opening;
   forming a dielectric layer on the lower electrode in the first opening, directly on a sidewall of the second opening, the dielectric layer contacting a second insulation layer on a first insulation layer and a first stepped portion between the first insulation layer and the second insulation layer, so that the electrode layer is covered with the dielectric layer; and
   forming an upper electrode on the dielectric layer.

8. The method of claim 7, wherein a plurality of protruding portions is formed on the bottom of the first opening.

9. The method of claim 7, wherein providing the substrate includes:
   patterning the first insulation layer formed on the substrate to the first width to thereby form the first opening;
   forming the lower electrode on the sidewall and the bottom of the first opening; and
   patterning the second insulation layer formed on the first insulation layer to the second width greater than the first width to thereby form the second opening connected to the first opening with the first stepped portion between the first and second insulation layers.

10. The method of claim 9, further comprising patterning a third insulation layer, the third insulation layer being under the first insulation layer, to a third width less than the first width to thereby form a third opening connected to the first opening with a second stepped portion between the third insulation layer and the first insulation layer, so that the lower electrode is extended to a sidewall and a bottom of the third opening from the second stepped portion.

11. The method of claim 9, further comprising forming a second lower wiring vertically through the first and second insulation layers, the second lower wiring making contact with a first lower wiring under the lower electrode for applying an electric field to the lower electrode.

12. The method of claim 11, wherein the second lower wiring is formed in a wiring opening that is formed simultaneously when the first opening is formed.

13. The method of claim 12, wherein the first opening and the wiring opening is formed through a dual damascene process.

14. The method of claim 12, wherein the second opening and the wiring opening is formed through a dual damascene process.

15. The method of claim 7, wherein providing the substrate includes:
- forming a first insulation layer on a substrate including a first lower wiring;
- patterning the first insulation layer to the first width to thereby form the first opening through which the first lower wiring is exposed;
- forming the lower electrode on a sidewall and a bottom of the first opening;
- filling the first opening with a conductive material to thereby form a dummy layer at a same level as the first insulation layer;
- forming a second insulation layer on the dummy layer and the first insulation layer;
- patterning the second insulation layer to the second width to thereby form the second opening through which the dummy layer is exposed; and
- removing the exposed dummy layer, so that the lower electrode in the first opening is exposed through the second opening.

16. The method of claim 15, wherein the dummy layer is removed through a wet etching.

17. The method of claim 15, wherein the conductive material includes copper.

18. The method of claim 7, wherein providing the substrate includes:
- sequentially forming a third insulation layer and a first insulation layer on a substrate including a first lower wiring;
- sequentially patterning the first insulation layer and the third insulation layer to the first width and a third width less than the first width, respectively, so that the first opening and a third opening having the third width are formed and the first lower wiring is exposed through the first and the third openings;
- forming the lower electrode on sidewalls and bottoms of the first and third openings;
- filling the first and third openings with a conductive material to thereby form a dummy layer at a same level as the first insulation layer;
- forming a second insulation layer on the dummy layer and the first insulation layer;
- patterning the second insulation layer to the second width to thereby form the second opening through which the dummy layer is exposed; and
- removing the exposed dummy layer, so that the lower electrode in the first and third openings is exposed through the second opening.

19. The method of claim 18, wherein the dummy layer is removed through a wet etching.

20. The method of claim 18, wherein the conductive material includes copper.

* * * * *